(12) United States Patent
Park et al.

(10) Patent No.: US 7,760,551 B2
(45) Date of Patent: Jul. 20, 2010

(54) METHOD OF PROGRAMMING NONVOLATILE MEMORY DEVICE

(75) Inventors: Sang-jin Park, Pyeongtaek-si (KR);
Kwang-soo Seol, Yongin-si (KR);
Ki-hwan Choi, Seongnam-si (KR);
Jung-hun Sung, Yongin-si (KR);
Sang-moo Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 120 days.

(21) Appl. No.: 12/232,082

(22) Filed: Sep. 10, 2008

(65) Prior Publication Data
US 2009/0067247 A1 Mar. 12, 2009

(30) Foreign Application Priority Data
Sep. 11, 2007 (KR) .................. 10-2007-0092292
Jul. 23, 2008 (KR) .................. 10-2008-0071896

(51) Int. Cl.
*G11C 16/04* (2006.01)

(52) U.S. Cl. ............... 365/185.19; 365/185.17; 365/185.18; 365/185.22; 365/185.27; 365/185.28

(58) Field of Classification Search ............ 365/185.17, 365/185.18, 185.19, 185.22, 185.27, 185.28
See application file for complete search history.

(56) References Cited

U.S. PATENT DOCUMENTS 7,606,072 B2 * 10/2009 Sekar et al. ............ 365/185.17
2008/0183951 A1 * 7/2008 Lee et al. ..................... 711/103

\* cited by examiner

*Primary Examiner*—Hoai V Ho
(74) *Attorney, Agent, or Firm*—Harness, Dickey & Pierce, P.L.C.

(57) ABSTRACT

A method of programming a nonvolatile memory device may include applying a program voltage to a memory cell. A supplementary pulse may be applied to the memory cell to facilitate thermalization of charges after the application of the program voltage. A recovery voltage may be applied to the memory cell after the application of the supplementary pulse. A program state of the memory cell may be verified using a verification voltage after the application of the recovery voltage.

23 Claims, 23 Drawing Sheets

FIG. 13
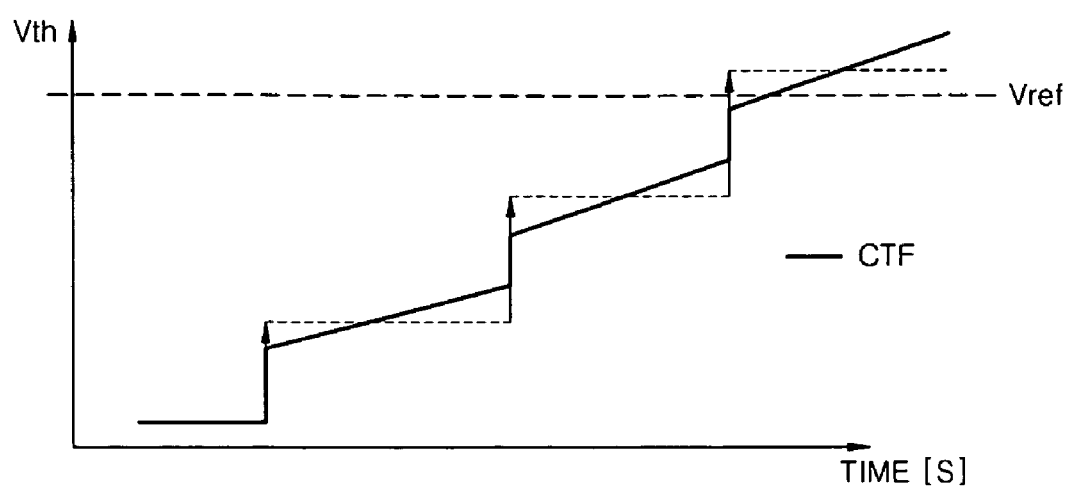
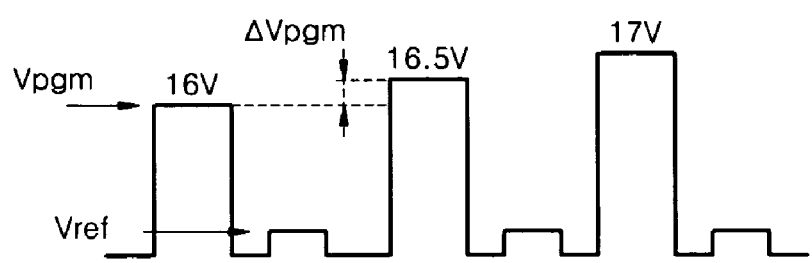

METHOD OF PROGRAMMING NONVOLATILE MEMORY DEVICE

PRIORITY STATEMENT

This application claims the benefit of priority to Korean Patent Application Nos. 10-2007-0092292 and 10-2008-0071896, respectively filed on Sep. 11, 2007 and Jul. 23, 2008, in the Korean Intellectual Property Office, the entire contents of which are incorporated herein in their entirety by reference.

BACKGROUND

1. Field

Example embodiments relate to a method of programming a nonvolatile memory device, and for example, to a method of programming a nonvolatile memory device which may more efficiently reduce a threshold voltage distribution in a program state.

2. Description of Related Art

Nonvolatile memories are storage devices capable of storing data even if a supply of power is discontinued. Floating gate type flash memories, which are operated by storing electric charges in a floating gate formed of polysilicon, have been commercialized as an example of larger capacity nonvolatile memories. A memory cell of a flash memory is classified into a single level cell (SLC) type in which two recording states of "1" and "0" are recorded in a single cell and a multi-level cell (MLC) type in which four or more recording states, for example, "11", "10", "01", and "00", are recorded in a single cell.

Multi-level cell technology is used in making a larger capacity NAND or NOR type flash memory. In an operation of a MLC, each recording state may be separately recognized only if the distribution of threshold voltages Vth of cells corresponding to a respective recording state is relatively smaller.

An incremental step pulse programming (ISPP) scheme for repeatedly applying a program voltage Vpgm while constantly increasing the program voltage Vpgm may be used to reduce a threshold voltage distribution between memory cells in a flash memory. According to the ISPP scheme, a step of applying a program voltage pulse while increasing the amount of an input program voltage pulse by ΔVpgm and checking a threshold voltage of a memory cell by applying a verifying voltage pulse is repeated so that the threshold voltage of the memory cell reaches a desired, or alternatively, a predetermined value. Because a plurality of memory cells forming the flash memory have an initial threshold voltage distribution, the ISPP scheme is introduced to allow all memory cells to reach a desired, or alternatively, a predetermined threshold voltage considering the threshold voltage distribution for each memory cell.

However, as a size of cells decreases in flash memories using a floating gate, coupling between cells, e.g., coupling between the floating gates, increases so that controlling the distribution of the threshold voltage is more difficult. Recently, to reduce the coupling between cells in an attempt to address the above problem of controlling the distribution of the threshold voltage, a charge trap flash (CTF) memory using, instead of the floating gate, an insulation layer including a charge trap site, for example, a charge trap layer, (e.g., silicon nitride $Si_3N_4$), which may trap electric charges, has been developed.

During programming of the CTF memory, injected electrons are trapped in the charge trap layer and localized therein. The injected electrons are thermalized in a deep trap and spatially spread throughout a nitride film. Accordingly, because the threshold voltage of a device changes as the electrons are thermalized and spatially spread, a certain time may be required until the threshold voltage Vth is fixed due to the localized electron thermalization.

Therefore, in the CTF memory, the threshold voltage Vth characteristically changes according to the time after programming due to the movement of the charges trapped in the charge trap layer after programming. The time-dependent threshold voltage change makes controlling the distribution of a threshold voltage during programming in the ISPP scheme more difficult.

If the threshold voltage Vth changes according to the time, an error may occur in the verification of a program state after a desired, or alternatively, a predetermined time passes after the programming. Due to the verification error, the distribution of a threshold voltage of a program state obtained by the ISPP type program increases.

For example, if the threshold voltage changes according to the time, even if the threshold voltage may reach a target value as time passes, a verification error that a memory cell has failed to reach the threshold voltage may occur as a result of verification. If the target threshold voltage is determined to have not been reached, a program voltage increased by ΔVpgm is applied for programming, and therefore, an over-program may occur in which the threshold voltage excessively increases. Accordingly, the distribution of the threshold voltage of the program state may increase.

SUMMARY

Example embodiments provide a method of programming a nonvolatile memory device which may reduce the distribution of a threshold voltage in a program state by reducing the occurrence of an over-program.

Example embodiments provide a method of programming a nonvolatile memory device which may shorten a saturation time of a threshold voltage that is relatively increased if a supplementary pulse is applied to a lower bulk or channel of a memory cell as compared to a saturation time if the supplementary pulse is applied to a gate by applying a recovery pulse after the supplementary pulse.

According to an example embodiment, a method of programming a nonvolatile memory device may include applying a program voltage to a memory cell. A supplementary pulse may be applied to the memory cell to facilitate thermalization of charges after the application of the program voltage. A recovery voltage may be applied to the memory cell after the application of the supplementary pulse. A program state of the memory cell may be verified using a verification voltage after the application of the recovery voltage.

According to an example embodiment, the supplementary pulse may apply an electric field having a polarity opposite to that of an electric field generated by the program voltage.

According to an example embodiment, the supplementary pulse may be applied via a bulk or channel where the memory cell is formed.

According to an example embodiment, the applying the program voltage, the applying the supplementary pulse, the applying the recovery voltage, and/or the verifying the program state may be repeated by increasing a level of the program voltage step by step until the program state of the memory cell passes the verification using the verification voltage.

According to an example embodiment, the memory cell may include a control gate and/or a charge storage layer, and/or the program voltage, the recovery voltage, and the verification voltage may be applied to the control gate of the memory cell.

According to an example embodiment, the recovery voltage may be a positive voltage having the same polarity as that of each of the verification voltage and the program voltage and the supplementary pulse has a polarity opposite to that of each of the program voltage, the recovery voltage, and the verification voltage.

According to an example embodiment, the memory cell may be at least one of a floating gate type flash memory cell and a charge trap type flash memory cell.

According to an example embodiment, the non-volatile memory device has a NAND structure of a plurality of memory cells formed on a bulk and the memory cell may be a memory cell selected from the memory cells arranged in the NAND structure.

According to an example embodiment, the bulk may be a p-well formed on a semiconductor substrate and the memory cells may be formed in the p-well in an array to share source/drain.

According to an example embodiment, the NAND structure comprises a plurality of strings, each having a plurality of memory cell arrays, and a ground selection transistor and a string selection transistor positioned at both sides of each string, and the application of a supplementary pulse having a polarity opposite to that of each of the program voltage, the verification voltage, and the recovery voltage is performed by operations of applying a voltage that is greater than 0 V to a common source and a ground selection transistor electrically connected to a string where a selected memory cell is positioned and applying a ground voltage to the selected memory cell.

According to another example embodiment, a method of programming a nonvolatile memory device may include applying a program voltage to a memory cell and verifying a program state of the memory cell using a first verification voltage in a first programming operation. A supplementary pulse may be applied to the memory cell to facilitate thermalization of charges with respect to the memory cell if the program state of the memory cell passes the verification using the first verification voltage in the first programming operation. A recovery voltage may be applied to the memory cell after the application of the supplementary pulse. The program state of the memory cell may be verified using a second verification voltage greater than the first verification voltage after the application of the recovery voltage.

According to an example embodiment, the supplementary pulse may be applied via a bulk or channel where the memory cell is formed.

According to an example embodiment, the recovery voltage is a positive voltage greater than the first and second verification voltages and having the same polarity as that of each of the first and second verification voltages and the program voltage, and the supplementary pulse has a polarity opposite to that of each of the program voltage, the recovery voltage, and the first and second verification voltages.

According to an example embodiment, the supplementary pulse may apply an electric field opposite to an electric field generated by the program voltage.

According to an example embodiment, the method may include applying the program voltage to the memory cell, applying the supplementary pulse to facilitate the thermalization of charges via the bulk or channel, applying the recovery voltage, and/or verifying the program state of the memory cell using the second verification voltage in a second programming operation if the program state of the memory cell fails the verification using the second verification voltage.

According to an example embodiment, in the second programming operation, the application of the program voltage, the application of the supplementary pulse, the application of the recovery voltage, and/or the verifying the program state of the memory cell using the second verification voltage may be repeated by increasing the program voltage step by step until the memory cell passes the verification using the second verification voltage in the second programming operation.

According to another example embodiment, in the first programming operation, the application of the program voltage and the verifying the program state of the memory cell using the first verification voltage may be repeated by increasing the program voltage step by step until the program state of the memory cell passes the verification using the first verification voltage.

According to another example embodiment, in the first programming operation, the application of the program voltage and the verifying the program state of the memory cell using the first verification voltage may be repeated by increasing the program voltage step by step until the program state of the memory cell passes the verification using the first verification voltage.

According to an example embodiment, the memory cell may include a control gate and/or a charge storage layer, and/or the program voltage, the recovery voltage, and/or the first and second verification voltages may be applied to the control gate of the memory cell.

According to an example embodiment, the memory cell may be at least one of a floating gate type flash memory cell and a charge trap type flash memory cell.

According to an example embodiment, the non-volatile memory device has a NAND structure of a plurality of memory cells formed on a bulk, and the memory cell is one selected from the memory cells arranged in the NAND structure.

According to an example embodiment, the bulk is a p-well formed on a semiconductor substrate and the memory cells are formed in the p-well in an array to share source/drain.

According to an example embodiment, the NAND structure comprises a plurality of strings, each having a plurality of memory cell arrays, and a ground selection transistor and a string selection transistor positioned at both sides of each string, and the application of a supplementary pulse having a polarity opposite to that of each of the program voltage, the verification voltage, and the recovery voltage is performed by operations of applying a voltage that is greater than 0 V to a common source and a ground selection transistor electrically connected to a string where a selected memory cell is positioned and applying a ground voltage to the selected memory cell.

According to example embodiments, because a threshold voltage may reach a saturation state within a shorter time by facilitating the thermalization of charges, over-programming due to a determination error may be reduced.

According to example embodiments, if a supplementary pulse is applied to a substrate with the application of a recovery pulse, a saturation time of a threshold voltage may be relatively extended in comparison to a time for applying the supplementary pulse to a gate of a memory cell.

According to an example embodiment, because a distribution of a threshold voltage of cells corresponding to a respective program state is lower, the program state in each multi-level cell operation may be separately recognized.

BRIEF DESCRIPTION OF THE DRAWINGS

The above and/or other aspects and advantages will become more apparent and more readily appreciated from the following detailed description of example embodiments taken in conjunction with the accompanying drawings of which:

FIG. 13 is an example waveform diagram of an ISPP voltage pulse applied to the selected word line during programming in a general ISPP scheme and an example graph showing a change in a threshold voltage during the programming of a charge trap flash (CTF) memory cell using the ISPP voltage pulse;

DETAILED DESCRIPTION OF EXAMPLE EMBODIMENTS

Figure 1:
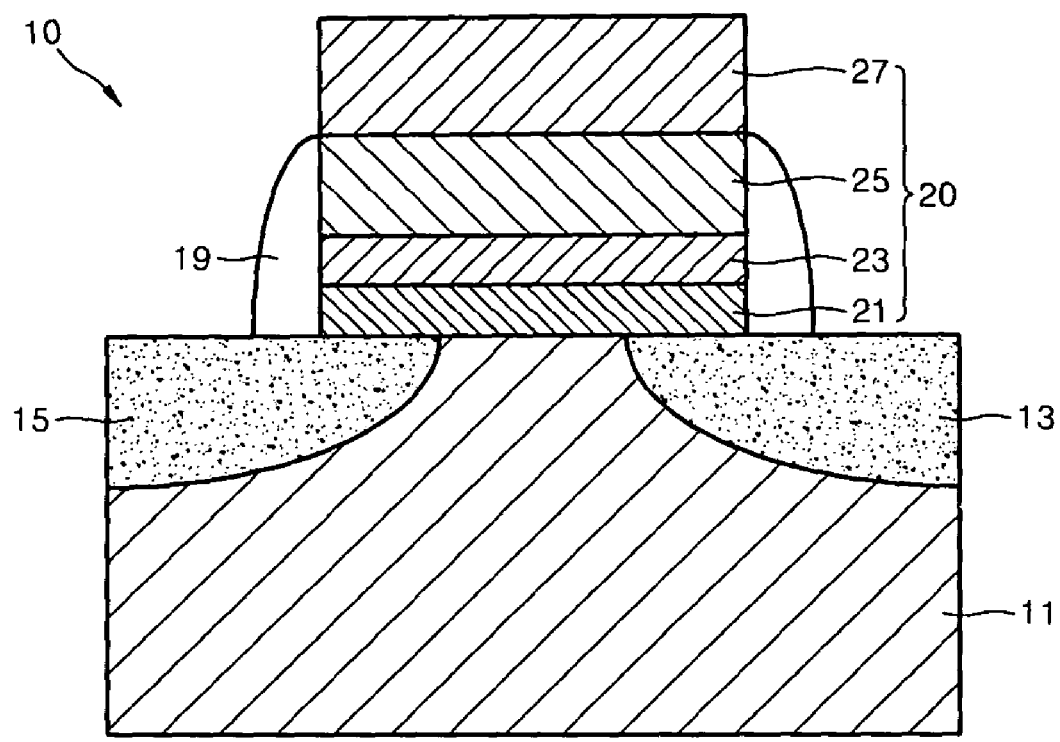
FIG. 1 illustrates an example of a flash memory cell adopting a program method according to example embodiments to perform a programming operation.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising,"

when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

A programming method according to an example embodiment may be applied to a nonvolatile memory device capable of recording data using charge storage, for example, a flash memory device. The flash memory device may have a plurality of memory cells each having a charge storage layer and/or a control gate. The charge storage layer may be a floating gate or a charge trap layer. For example, the memory cell may be a floating gate type flash memory cell or a charge trap type flash memory cell.

FIG. 1 illustrates an example of a flash memory cell 10 adopting a programming method according to an example embodiment to perform a programming operation. The flash memory cell 10 of FIG. 1 may be a memory cell of a NAND type flash memory device that will be described later with reference to FIG. 2.

Referring to FIG. 1, the flash memory cell 10 may include a bulk 11 and/or a gate structure 20 formed on the bulk 11. First and second impurity regions 13 and 15, which are doped with a desired, or alternatively, a predetermined conductive impurity, may be formed in the bulk 11. One of the first and second doped regions 13 and 15 may be used as a drain D and the other one may be used as a source S.

When the flash memory device having the flash memory cell 10 is erased in units of blocks, the bulk 11 may be a p-well as shown in FIGS. 9B-12B. Also, the bulk 11 may be a semiconductor substrate for forming the flash memory device.

The gate structure 20 may include a tunneling insulating layer 21 formed on the bulk 11, a charge storage layer 23 formed on the tunneling insulating layer 21, and/or a blocking insulating layer 25 formed on the charge storage layer 23. A control gate 27 may be formed on the blocking insulating layer 25. In FIG. 1, the gate structure 20 may include a spacer 19 formed on sidewalls of the tunneling insulating layer 21, the charge storage layer 23, and/or the blocking insulating layer 25.

The tunneling insulating layer 21 may be a layer for tunneling of charges. The first and second impurity regions 13 and 15 may be formed on the bulk 11 to be electrically connected to the tunneling insulating layer 21. The tunneling insulating layer 21 may be a tunneling oxide layer formed of, for example, $SiO_2$, various high-k oxides, or a combination thereof.

Alternatively, the tunneling insulating layer 21 may be formed of a silicon nitride layer, for example, $Si_3N_4$. For the silicon nitride layer, an impurity concentration thereof may not be relatively high, e.g., the impurity concentration of the silicon nitride film may be similar to that of a silicon oxide layer, and/or a boundary surface characteristic with silicon may be superior. As another alternative, the tunneling insulating layer 21 may have a dual layer structure of a silicon nitride layer and an oxide layer. The tunneling insulating layer 21 may be a single layer structure of an oxide, nitride, or a multilayer structure of materials having different energy band gaps.

The charge storage layer 23 may be an area where information is stored by charge storage. The charge storage layer 23 may be formed of a charge trap layer or a floating gate. For example, in order to function as a charge trap layer, the charge storage layer 23 may include any one of a nitride, a high-k dielectric material having a higher permittivity, and nanodots. For example, the charge storage layer 23 may be formed of a nitride, e.g., $Si_3N_4$, or a high-k oxide, e.g., $HfO_2$, $ZrO_2$, $Al_2O_3$, HfSiON, HfON, or HfAlO. The charge storage layer 23 may include a plurality of nanodots discontinuously arranged as a charge trap site. The nanodots may be formed in a nanocrystal form. If the charge storage layer 23 is formed to function as the charge trap layer, the flash memory cell 10 may become a charge trap flash (CTF) memory cell.

The charge storage layer 23 may include, for example, polysilicon. If the charge storage layer 23 includes polysilicon, the charge storage layer 23 may function as a floating gate and the flash memory cell 10 may become a floating gate type flash memory cell.

The blocking insulating layer 25 may reduce the occurrence of charges moving upward after passing the area where the charge storage layer 23 is formed. The blocking insulating layer 25 may be formed of an oxide layer. The blocking insulating layer 25 may be formed of $SiO_2$ or a high-k material having a permittivity higher than that of the tunneling insulating layer 21, for example, $Si_3N_4$, $Al_2O_3$, $HfO_2$, $Ta_2O_5$, or $ZrO_2$. The blocking insulating layer 25 may be formed of a multilayer structure. For example, the blocking insulating layer 25 may have a structure of two layers or more including an insulation layer formed of a typical insulation material, e.g., $SiO_2$, and a high dielectric layer formed of a material having a permittivity higher than that of the tunneling insulating layer 21.

The control gate 27 may be formed of a metal layer, for example, TaN, Al, Ru, or a silicide material, e.g., NiSi. If electrons are injected in the flash memory cell 10, the injected electrons may be stored in the charge storage layer 23, and therefore, the flash memory cell 10 may have a threshold voltage in a program state.

The flash memory cell 10 may have two states, for example, a program state and an erase state. The erase state may be an ON state in which current may flow to the drain D connected to a bit line (not shown) by a voltage supplied to the control gate 27 during reading by decreasing a threshold voltage of the flash memory cell 10. The program state may be an OFF state in which current may not flow to the drain connected to the bit line by the voltage supplied to the control gate 27 during reading by increasing the threshold voltage of the flash memory cell 10.

The programming method according to example embodiments may be applied for programming a flash memory device including above-described flash memory cell 10.

In FIG. 1, the flash memory cell 10 is a top gate type flash memory cell including the control gate 27 located in an upper side thereof. However, a memory cell of a nonvolatile memory device adopting a programming method according to example embodiments is not limited thereto and the memory cell may be a bottom gate type flash memory cell in which the control gate 27 is located under the charge storage layer 23.

A programming method according to example embodiments may be used for programming a flash memory device adopting a floating gate type or a charge trap type flash memory cell. A programming method according to example embodiments may be applied if a supplementary pulse is applied via a lower bulk or channel of the memory cell.

Figure 2:
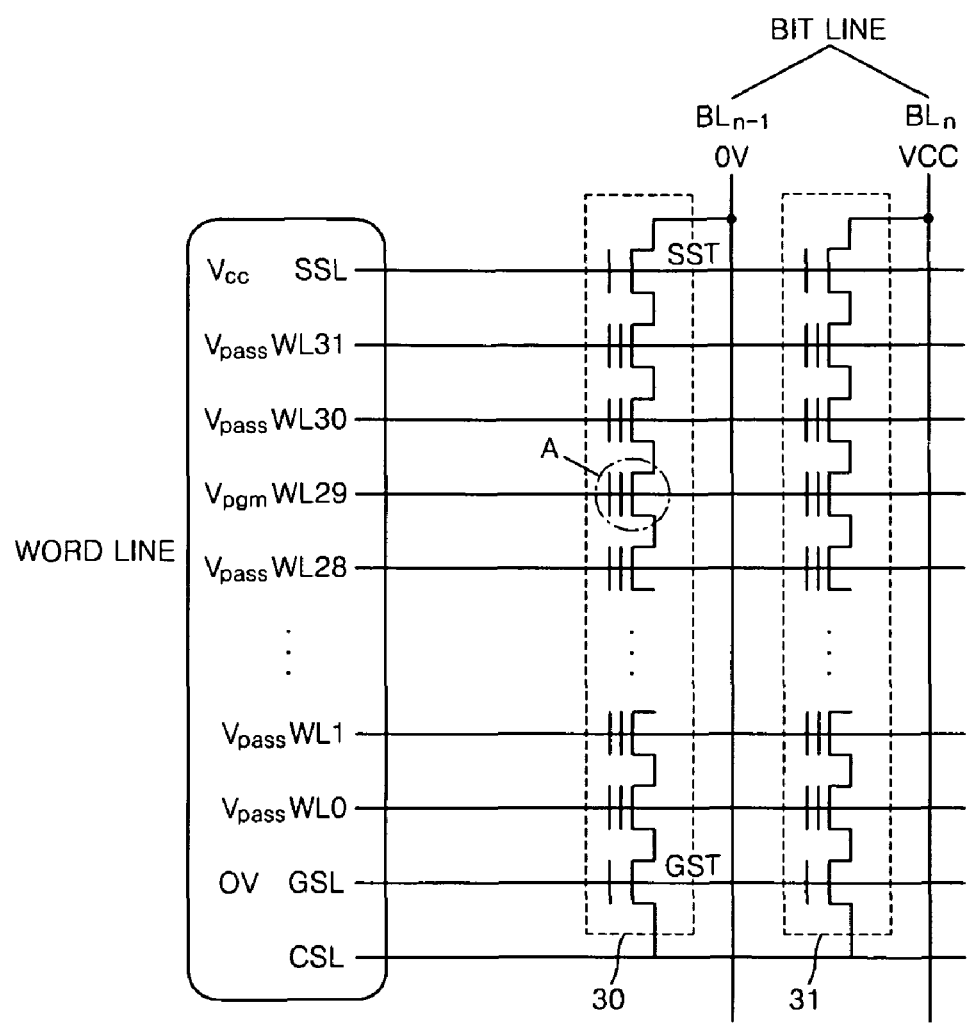
FIG. 2 is a circuit diagram of a NAND type flash memory device as an example of a nonvolatile memory device adopting a program method according to an example embodiment.

FIG. 2 is a circuit diagram of a NAND type flash memory device as an example of a nonvolatile memory device adopting a programming method of example embodiments. Referring to FIG. 2, the NAND type flash memory device may be formed of a plurality of cell strings. In FIG. 2, two cell strings 30 and 31 are shown as an example for ease of description, however, example embodiments may include more or less than two cell strings.

Each of the cell strings 30 and 31 may include a plurality of memory cell arrays sharing a source and a drain with a neighboring memory cell. Each memory cell of the cell strings 30 and 31 may be a charge trap type flash memory cell or a floating gate type flash memory cell.

A ground selection transistor (GST), a plurality of memory cells, and/or a string selection transistor (SST) may be connected in series to each of the cell strings 30 and 31. One end of each of the cell strings 30 and 31 may be connected to a bit line (BL) and/or the other end may be connected to a common source line (CSL). The GST may be connected to a common source line (CSL) and the SST may be connected to the bit line BL.

In a direction crossing the direction of the cell strings 30 and 31, word lines (WL) may be connected to the control gate 27 of the memory cells, a string selection line (SSL) may be connected to a gate of the SST, and/or a ground selection line (GSL) may be connected to a gate of the GST. In FIG. 2, each of the cell strings 30 and 31 includes thirty two (32) memory cells and each memory cell is connected to the work lines WL0-WL31.

Data programmed in each of the memory cell may vary according to a voltage of the bit line BL. If a voltage of the bit line BL is a power voltage Vcc, programming may be inhibited. On the other hand, if the voltage of the bit line BL is a ground voltage 0 V, programming may be permitted. In FIG. 2, a ground voltage 0 V may be supplied to a bit line BLn−1 and/or the power voltage Vcc may be supplied to a bit line BLn.

During programming, a program voltage Vpgm may be supplied to a selected word line, for example, a word line WL29. A pass voltage Vpass may be supplied to the unselected word lines, for example, word lines WL31, WL30, and WL28-WL0. For example, a voltage that increases by 0.5 V step by step with a basic voltage of 16 V may be provided as the program voltage Vpgm and a voltage of 8-10 V may be provided as the pass voltage Vpass. The power voltage Vcc may be supplied to the SSL and/or the ground voltage 0 V may be applied to the GSL.

In the selected word line WL 29, a memory cell corresponding to a bit line BLn−1 to which the ground voltage is supplied may be programmed. For example, in FIG. 2, a memory cell A is programmed.

Figure 3:
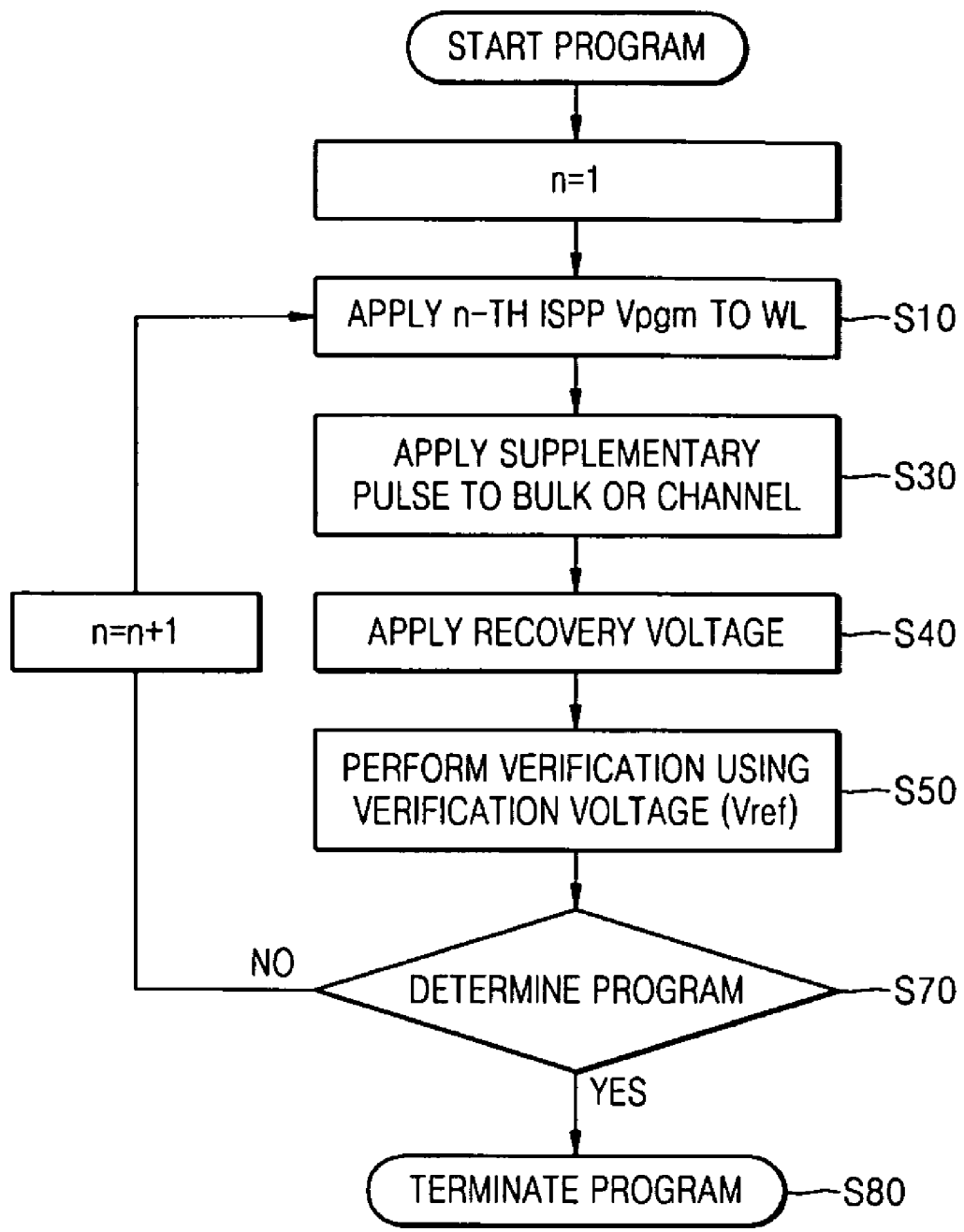
FIG. 3 is a flowchart illustrating a method of programming a nonvolatile memory device according to an example embodiment.

FIG. 3 is a flowchart illustrating a method of programming a nonvolatile memory device according to an example embodiment. If a supplementary pulse for facilitating the thermalization of charges during programming is applied to the bulk or channel, for example, in a bulk (substrate) or channel pulse modulation, the saturation time of the threshold voltage may be relatively extended compared to that during the application of the supplementary pulse to the control gate, for example, in a gate pulse modulation because a discharge time after the supplementary pulse is applied to the bulk or channel may be needed. Accordingly, example embodiments may apply a recovery voltage, for example, via a control gate of the memory cell, after the supplementary pulse is applied. Of course, since the discharge time after the pulse is applied to the channel is shorter than that after the pulse is applied to the bulk, the recovery pulse applied after the pulse is applied to the channel may have a voltage smaller than that of the recovery pulse applied after the pulse is applied to the bulk. When the non-volatile memory device to which the programming method of the present embodiment is applied is a flash memory device, since an erasure operation is performed in units of blocks, the bulk may be the p-well of FIGS. 9B-12B or a semiconductor substrate where the flash memory device is formed.

In a programming method according to an example embodiment, to reduce the distribution of a threshold voltage in a program state by reducing the occurrence of an over-program, a supplementary pulse to facilitate the thermalization of charges during program using an incremental step pulse programming (ISPP) scheme may be applied to a lower bulk or channel of a memory cell and/or a recovery pulse may be applied after the supplementary pulse is applied. Accordingly, because the threshold voltage is more quickly thermalized as the charges are thermalized within a shorter time, over programming due to the program being performed again due to a determination error that the threshold voltage is lower than a reference value may be reduced. Therefore, the threshold voltage distribution of the program state may be more greatly reduced compared to a case of programming using a conventional incremental step pulse programming (ISPP) scheme.

Figure 4:
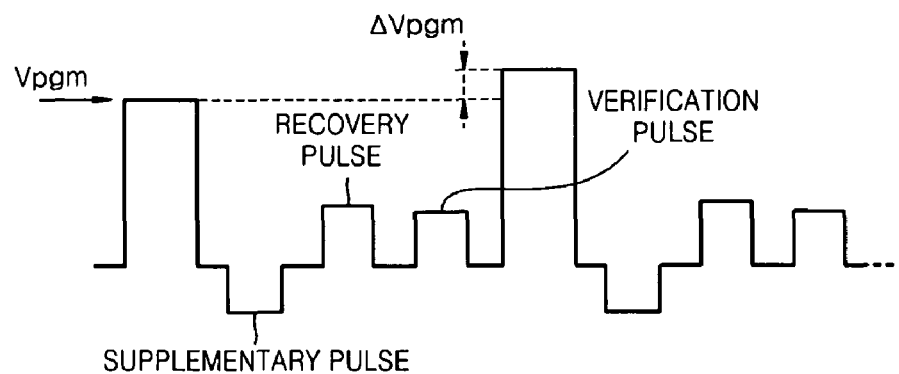
FIG. 4 is an example waveform diagram showing an improved incremental step pulse programming (ISPP) scheme according to the program method of FIG. 3.

FIG. 4 is an example waveform diagram illustrating an improved ISPP scheme according to the programming method of FIG. 3.

Referring to FIGS. 3 and 4, in a programming method according to an example embodiment, a program voltage may be applied to a memory cell and a supplementary pulse to facilitate the thermalization of charges may be applied via the bulk or channel where the memory cell is formed. A recovery voltage may be applied and a program state of the memory cell may be verified using a verification voltage Vref. The recovery voltage may be a positive voltage like the verification voltage Vref and/or greater than the verification voltage Vref. That is, the recovery voltage may be a positive voltage that is the same polarity as that of the verification voltage Vref and the program voltage.

If the ISPP scheme is employed, applying the program voltage, the supplementary pulse, the recovery voltage, and/or the verification operation including the verification voltage Vref by increasing the amount of the program voltage step by step may be repeated until the memory cell passes verification using the verification voltage Vref.

Referring to FIGS. 2-4, a programming method according to an example embodiment if the ISPP scheme is applied will now be described in detail. If a programming mode begins, a desired, or alternatively, a predetermined word line WL, for example, the word line WL29, may be selected by data input. If the selected word line WL29 and the bit line BLn−1 are set to a ground voltage, for example, 0 V, a memory cell connected to the selected word line WL29 and the bit line BLn−1 may be selected. The selected memory cell, in this case the memory cell A, may be programmed using the programming method according to example embodiments. As described above, FIG. 2 shows an example in which the memory cell A located on the word line WL29 is selected.

Operations of applying the program voltage Vpgm to the selected memory cell (S10), applying a supplementary pulse to the bulk or channel (S30), applying a recovery voltage (S40), performing the verification using the verification voltage Vref (S50), and/or determining whether the memory cell passes the verification using the verification voltage Vref (S70) may be repeated by increasing the program voltage Vpgm step by step by ΔVpgm until the memory cell passes the verification using the verification voltage Vref.

For example, the n-th ISPP Vpgm may be applied to the word line WL. The ISPP Vpgm if n=1 may be a basic program voltage applied during the ISPP scheme. If the program voltage increases step by step, for example, by 0.5 V from 16 V, the ISPP Vpgm if n=1 is 16 V. Because the ISPP Vpgm, the recovery voltage, and/or the verification voltage Vref are applied to the word line WL, the program voltage, the recovery voltage, and the verification voltage Vref may be substantially applied to the selected memory cell via the control gate.

Whether the selected memory cell is programmed to have a desired, or alternatively, a threshold voltage, (e.g., a threshold voltage corresponding to the verification voltage Vref), may be determined (S70). If the selected memory cell passes the verification using the verification voltage Vref, the program is terminated (S80). If the selected memory cell does not pass the verification using the verification voltage Vref, processing may return to step (S10).

In the supplementary pulse application operation (S30), the supplementary pulse may apply an electric field opposite to an electric field of the program voltage. For example, the supplementary pulse may be a DC supplementary pulse having a polarity opposite to that of the program voltage as shown in FIG. 4. Since the program voltage may be a positive voltage having the same polarity as that of the recovery voltage or the verification voltage, the supplementary pulse may be a voltage having a polarity opposite to that of the program voltage, the recovery voltage, or the verification voltage. According to an example embodiment, because the DC supplementary pulse is applied to the bulk or channel, the DC supplementary pulse may be applied as a positive voltage with respect to the bulk or channel. The voltage of the supplementary pulse may be less than that of the program voltage.

Figure 5A:
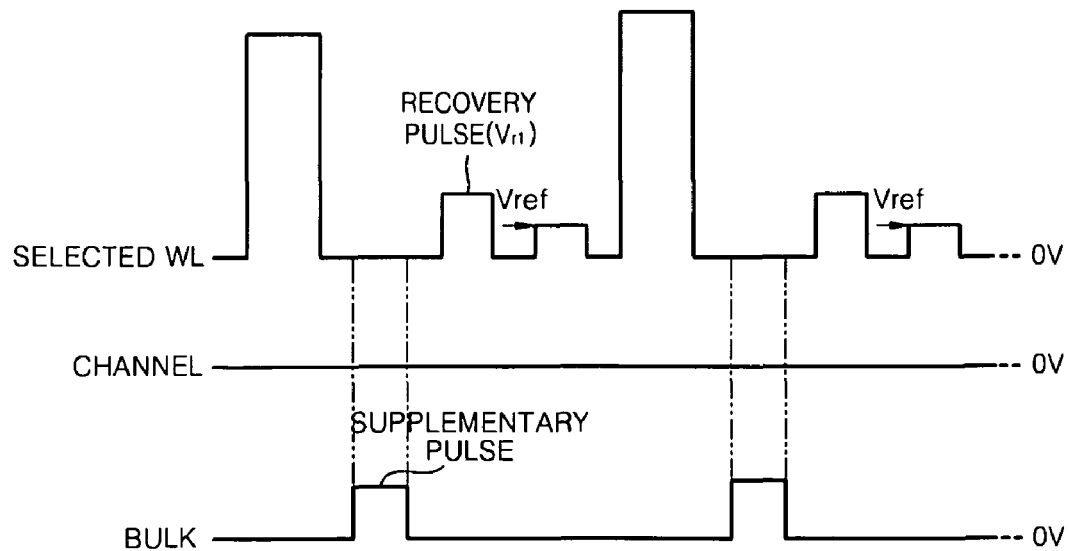
FIG. 5A is an example waveform diagram showing an example embodiment in which a supplementary pulse is applied via a bulk when a program voltage, a recovery voltage, and a verification voltage are applied through a selected word line WL, e.g., a control gate of the selected memory cell.

FIG. 5A is an example waveform diagram showing an example embodiment in which a supplementary pulse is applied via the bulk if a program voltage, a recovery voltage, and a verification voltage are applied through a selected word line WL, e.g., a control gate of the selected memory cell. The supplementary pulse may be applied via the bulk of a non-volatile memory device where a plurality of memory cells are formed as in FIG. 5.

If the supplementary pulse is applied to the bulk, charges injected in the charge storage layer may be more uniformly distributed in the charge storage layer at a faster speed. Accordingly, compared to a case in which the supplementary pulse is not applied, a time required for the thermalization of the threshold voltage of a memory cell after the charges are injected in the charge storage layer may be greatly reduced.

Figure 5B:
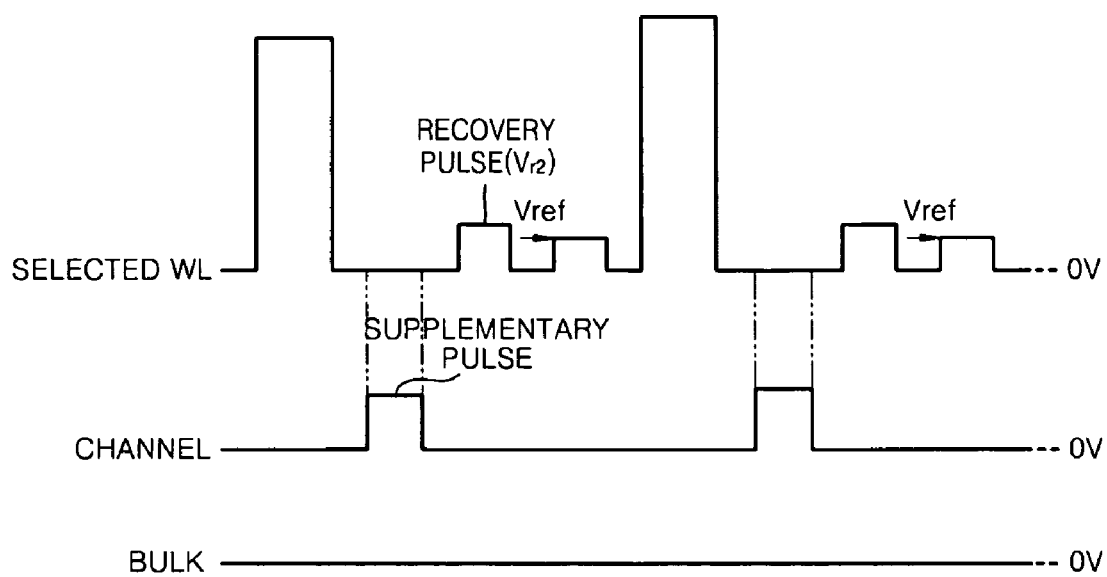
FIG. 5B is a waveform diagram showing an example embodiment in which a supplementary pulse is applied via a channel when a program voltage, a recovery voltage, and a verification voltage are applied through a selected word line WL, e.g., a control gate of the selected memory cell.

Because the recovery pulse Vr1 is applied via the control gate of the memory cell after the supplementary pulse, a discharge time required by the application of the supplementary pulse to the bulk may be reduced so that the threshold voltage saturation time may be more greatly shortened. FIG. 5B illustrates an embodiment in which the supplementary pulse is applied via the channel when the program voltage, the recovery voltage, and the verification voltage are applied via a selected word line WL, that is, the control gate of a selected memory cell. Referring to FIG. 5B, the supplementary pulse may be applied via the channel of a non-volatile memory device where a plurality of memory cells are formed. When the supplementary pulse is applied to the channel, the charges injected in the charge storage layer are quickly and uniformly distributed in the charge storage layer. Accordingly, compared to a case in which the supplementary pulse is not applied, the time for the threshold voltage of the memory cell to be maintained constant after the charges are injected in the charge storage layer can be greatly reduced.

Also, since a recovery pulse Vr2 is applied via the control gate of the memory cell after the supplementary pulse is applied, a discharge time needed by applying the supplementary pulse to the channel may be shortened so that a threshold voltage saturation time can be greatly reduced. Since the discharge time after the pulse is applied to the channel is shorter than the discharge time after the pulse is applied to the bulk, the recovery pulse Vr2 applied after the pulse is applied to the channel may have a voltage smaller than the recovery pulse Vr1 applied after the pulse is applied to the bulk.

Figure 6:
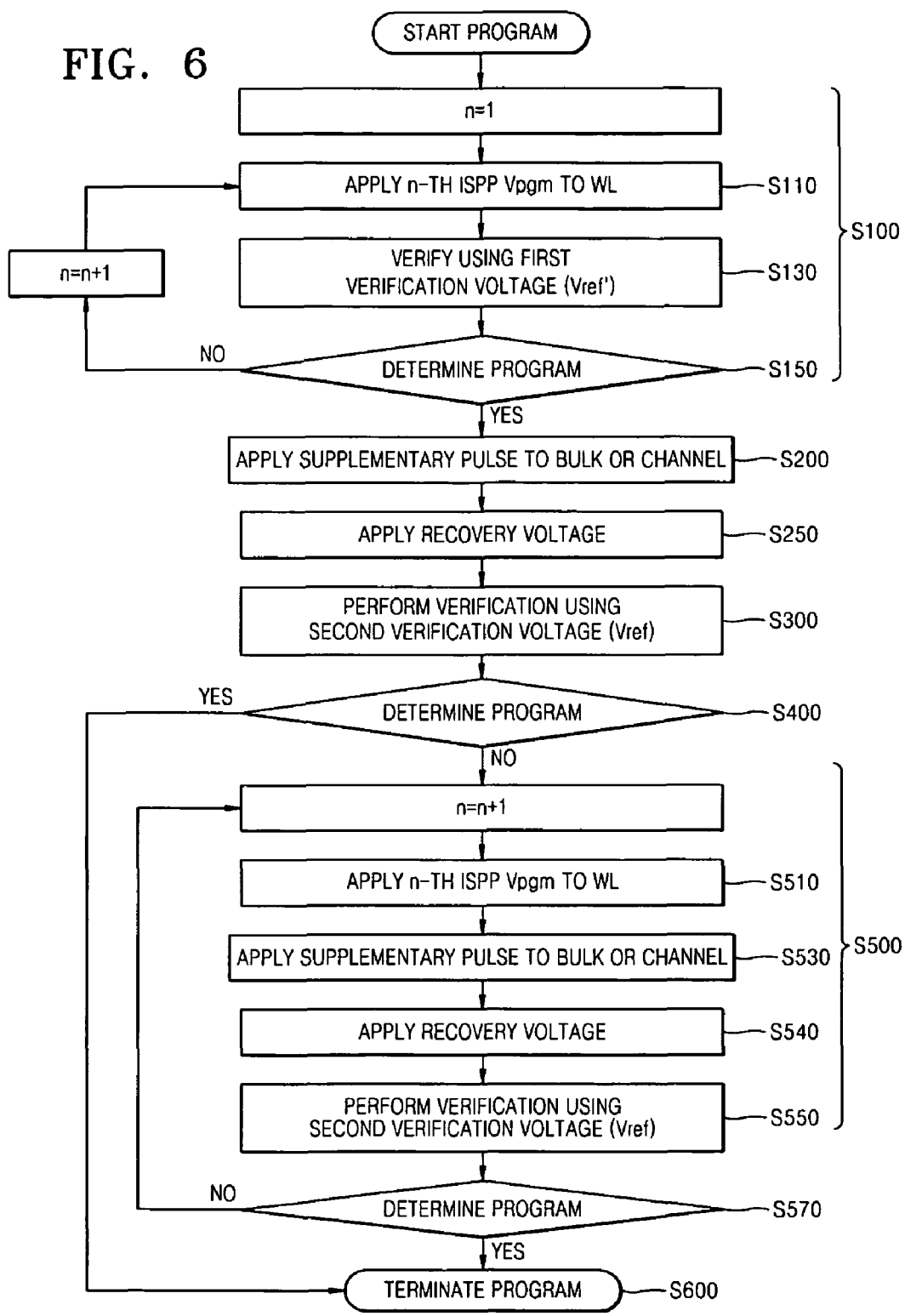
FIG. 6 is a flowchart illustrating a method of programming a nonvolatile memory device according to another example embodiment.
Figure 7:
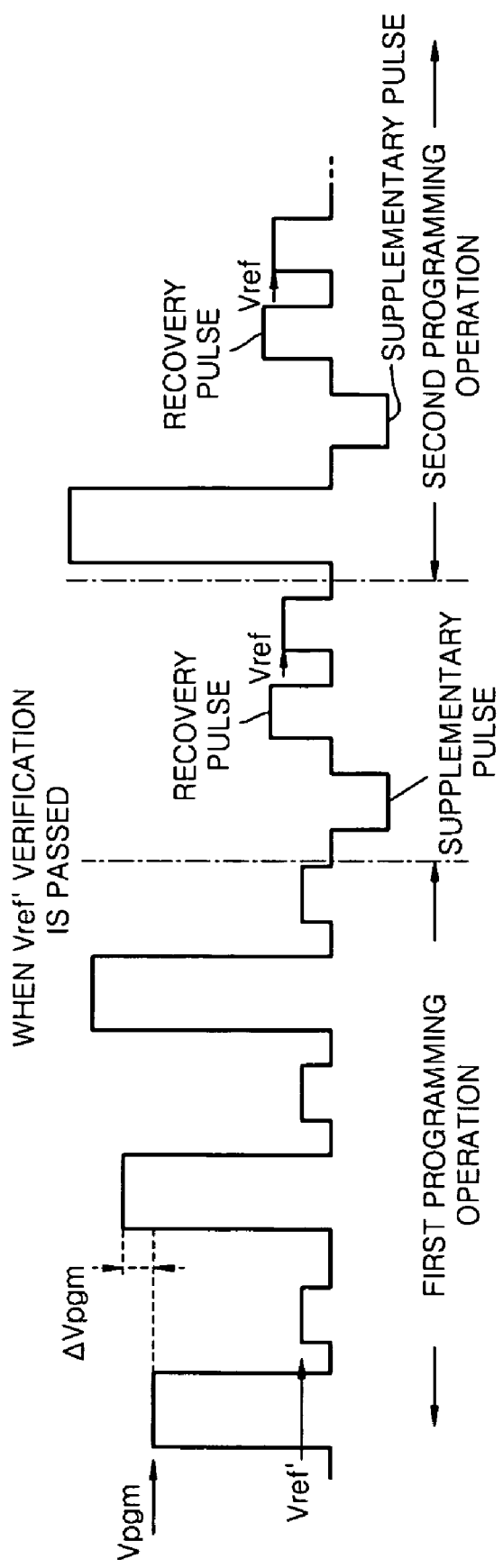
FIG. 7 is an example waveform diagram showing an improved ISPP scheme according to the program method of FIG. 6.

FIG. 6 is a flowchart illustrating a method of programming a nonvolatile memory device according to another example embodiment. FIG. 7 is an example waveform diagram showing an improved ISPP scheme according to the programming method of FIG. 6. In a programming method according to another example embodiment, as compared to above-described example embodiments, because the verification voltage is applied in two steps, the supplementary pulse and recovery voltage may be applied only if the memory cell reaches a desired, or alternatively, a predetermined threshold voltage. Therefore, a program time due to the application of the supplementary pulse and the recovery voltage may be reduced.

Referring to FIGS. 6 and 7, a programming method according to another example embodiment may include applying a program voltage to a memory cell and verifying the program state of the memory cell using a first verification voltage Vref' (S100, a first programming operation), applying a supplementary pulse to facilitate the thermalization of charges via the bulk or channel to the memory cell that passes a verification using the first verification voltage Vref' (S200), applying a recovery voltage after applying the supplementary pulse (S250), and/or verifying the program state of the memory cell using a second verification voltage Vref greater than the first verification voltage Vref' after the recovery voltage is applied (S300).

A programming method according to another example embodiment may include a second programming operation (S500) that is performed if in the program determination operation (S400) it is determined that the memory cell does not pass the verification using the second verification voltage Vref. The second programming operation (S500) may include applying the program voltage to the memory cell, applying the supplementary pulse to facilitate the thermalization of charges via the bulk or channel, applying the recovery voltage, and/or verifying the program state of the memory cell using the second verification voltage Vref.

If the ISPP scheme is employed, in the first programming operation (S100), the application of the program voltage and the verification operation using the first verification voltage Vref' may be repeated by increasing the program voltage step by step until the memory cell passes the verification using the first verification voltage Vref'. Similarly, in the second programming operation (S500), the applications of the program voltage, the supplementary pulse, the recovery voltage, and/or the verification operation including the second verification voltage Vref may be repeated by increasing the program voltage step by step until the memory cell passes the verification using the second verification voltage Vref.

A programming method according to another example embodiment employing the ISPP scheme will now be described in detail with reference to FIGS. 2, 6, and 7. If a programming mode begins, a desired, or alternatively, a predetermined word line WL, for example, the word line WL29, may be selected by data input. If the selected word line WL29 and the bit line BLn−1 are set to a ground voltage, for example, 0 V, a memory cell connected to the selected word line WL29 an the bit line BLn−1 may be selected. A programming method according to another example embodiment may be performed with respect to the selected memory cell. As described above, FIG. 2 shows an example in which the memory cell A located on the word line WL29 is selected.

A program according to the first programming operation (S100) may be performed with respect to the selected memory cell. In the first programming operation (S100), the operations of applying the program voltage Vpgm to the selected memory cell (S110), verifying the program state of the memory cell using the first verification voltage Vref' (S130), and/or determining whether the memory cell has passed a verification using the first verification voltage Vref' (S150) may be repeated by increasing the program voltage Vpgm step by step by ΔVpgm, until the memory cell has passed the verification using the first verification voltage Vref'.

For example, the n-th ISPP Vpgm may be applied to the word line WL. The ISPP Vpgm if n=1 is a basic program voltage applied during the ISPP scheme. If the program voltage increases step by step, for example, by 0.5 V from 16 V, the ISPP Vpgm if n=1 is 16 V. Because the ISPP Vpgm and the first verification voltage Vref' are applied to the word line WL, the program voltage and the verification voltage Vref' may be substantially applied to the selected memory cell via the control gate.

If the program state of the selected memory cell is determined to not pass the verification using the first verification voltage Vref', the program voltage may increase by a step and processing returns to step (S110). If the program state of the selected memory cell is determined to pass the verification using the first verification voltage Vref' (S150), the supplementary pulse to facilitate the thermalization of charges may be applied to the bulk or channel (S200). The program state of the selected memory cell may be verified using the second verification voltage Vref greater than the first verification voltage Vref' (S300). A determination is made as to whether the selected memory cell is programmed to have a desired, or alternatively, a predetermined threshold voltage, e.g., a threshold voltage corresponding to the second verification voltage Vref (S400).

If the program state of the selected memory cell is determined in the program determined operation (S400) to pass the verification using the second verification voltage Vref, the program is terminated (S600). If the program state of the selected memory cell is not determined in the program operation (S400) to pass the verification using the second verification voltage Vref, the second programming operation (S500) may be performed.

The second programming operation (S500) may include application of the n-th ISPP Vpgm to the word line WL (S510), application of the supplementary pulse via the bulk or channel (S530), application of the recovery voltage via the word line WL (S540), the verification of the program state of the memory cell using the second verification voltage Vref through the word line WL (S550), and/or determining whether the memory cell passes the verification using the second verification voltage Vref (S570). The second programming operation (S500) may be repeated by increasing the program voltage Vpgm step by step by ΔVpgm until the memory cell passes the verification using the second verification voltage Vref. If the program state of the selected memory cell is determined to pass the verification using the second verification voltage Vref in the second programming operation (S500), the program is terminated (S600). If the program state of the selected memory cell is determined not to pass the verification using the second verification voltage Vref in the second programming operation (S500), the program voltage Vpgm may be incremented by a step and processing may return to step (S510).

The ISPP Vpgm first applied to the word line WL in the second programming operation (S500) may be a voltage increased by ΔVpgm greater than the ISPP Vpgm applied last in the first programming operation (S100). Because in the second programming operation (S500) the ISPP Vpgm, the recovery voltage, and the second verification voltage Vref are applied to the word line WL, the program voltage, the recovery voltage, and/or the second verification voltage Vref may be substantially applied to the selected memory cell via the control gate.

In the supplementary pulse application operations described above (S200 and S530), the supplementary pulse may apply an electric field opposite to that of the program voltage Vpgm. For example, as shown in FIG. 7, the supplementary pulse may be a DC supplementary pulse having a polarity opposite to that of the program voltage Vpgm. According to an example embodiment, because a DC supplementary pulse is applied to the bulk or channel, the DC supplementary pulse may be applied to the bulk or channel as a positive voltage. An amplitude of the supplementary pulse may be less than that of the program voltage Vpgm.

Figure 8A:
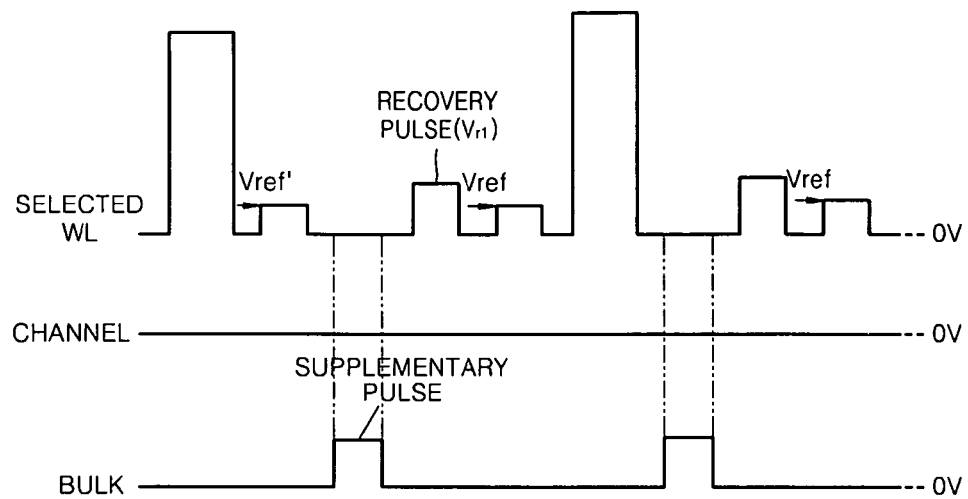
FIG. 8A is an example waveform diagram showing an example embodiment in which a supplementary pulse is applied via a bulk and a program voltage, a recovery voltage, and first and second verification voltages Vref' and Vref are applied through a selected word line WL, e.g., a control gate of the selected memory cell.

FIG. 8A is an example waveform diagram showing an example embodiment in which the supplementary pulse is applied via the bulk while the program voltage, the recovery voltage, and the first and second verification voltages Vref' and Vref are applied through the selected word line WL, e.g., the control gate of the selected memory cell. As shown in FIG. 8A, the supplementary pulse may be applied through the bulk of the nonvolatile memory device in which the memory cells are formed.

Figure 8B:
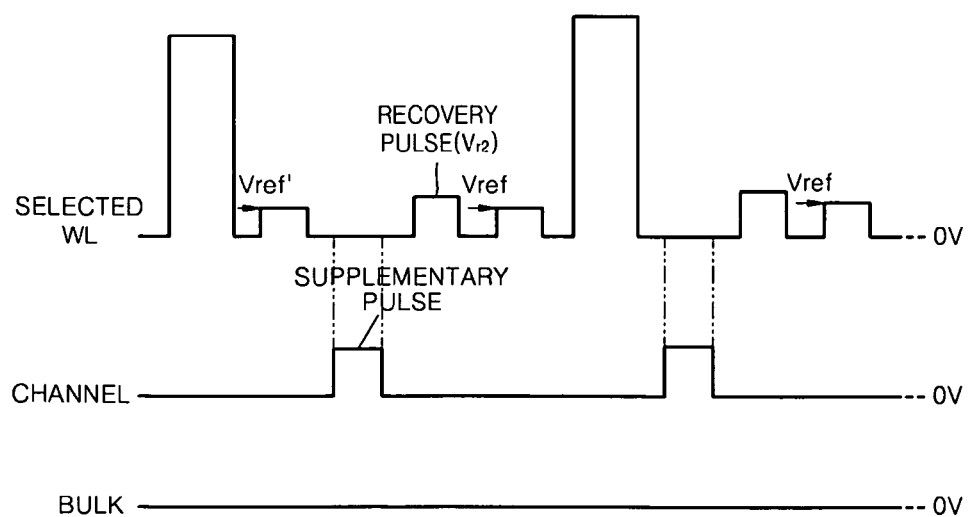
FIG. 8B is an example waveform diagram showing an example embodiment in which a supplementary pulse is applied via a channel and a program voltage, a recovery voltage, and first and second verification voltages Vref' and Vref are applied through a selected word line WL, e.g., a control gate of the selected memory cell.

FIG. 8B illustrates an embodiment in which the program voltage, the recovery voltage, and the first and second verification voltages Vref' and Vref are applied via a selected word line WL, that is, the control gate of a selected memory cell and the supplementary pulse is applied via the channel.

The supplementary pulse may be applied via the channel of a non-volatile memory device in which a plurality of memory cells are formed as shown in FIG. 8B. As in FIGS. 5A and 5B, in FIGS. 8A and 8B, since the discharge time after the pulse is applied to the channel is shorter than the discharge time after the pulse is applied to the bulk, the recovery pulse Vr2 applied after the pulse is applied to the channel may have a voltage smaller than the recovery pulse Vr1 that is applied after the pulse is applied to the bulk.

In FIGS. 8A and 8B, the supplementary pulse is a DC pulse having a polarity opposite to that of the program voltage. However, this is exemplary and the supplementary pulse is not limited thereto. For example, the supplementary pulse may be an AC pulse.

If the supplementary pulse is applied for each step of applying the ISPP Vpgm, the program time may be increased as long as a multiplication of a supplementary pulse application time by an application number. In a programming method according to another example embodiment, the supplementary pulse and the recovery pulse may be applied only if the memory cell passes the verification using the first verification voltage Vref' to reduce an increase in the program time. The first verification voltage Vref' may be set in consideration of a difference between a threshold voltage during the verification and a threshold voltage after the thermalization.

According to results of example experiments, a distribution range of the threshold voltages of example memory cells for a same measurement time may be about ~0.1 V. The threshold voltage of each memory cell may vary as much as 0.528±0.01 V according to a time passage from 5 μs to 350 μs. The change in the threshold voltage of the memory cell during the verification and after the thermalization may be about 0.528 V, and/or a difference in an amount of change in the threshold voltage of the memory cells may not be greater than 0.03 V.

Because the difference between a threshold voltage of the memory cell during the verification and a threshold voltage of the memory cell after the thermalization is a constant value within an error range of 0.03 V, for example, about 0.528 V, the first verification voltage Vref' may be set accordingly.

For example, the first verification voltage Vref' may be set to be less than the second verification voltage Vref by a difference between a threshold voltage during the verification and a threshold voltage after the thermalization. For example, the first verification voltage Vref' may be set such that Vref'=Vref−xV, where V signifies 1 V. Because the difference between a threshold voltage during the verification and a threshold voltage value after the thermalization is less than 1 V, 0<x<1. "x" may vary according to the program voltage or a record page within the above range. Because the program may be performed in units of word lines, the page corresponds to the word line.

A non-volatile memory device to which the programming method according to the present embodiment is applied has a NAND structure of the memory cells formed on the bulk (please refer to FIG. 2). A memory cell programmed in the programming method of the present embodiment may be selected from the memory cells arranged in a NAND structure. The bulk may be a p-well formed in the semiconductor substrate and the memory cells may be formed in the p-well as an array to share the source/drain.

Also, as shown in FIG. 2, the NAND structure includes a plurality of strings, each including a plurality of memory cells, and a ground selection transistor and a string selection transistor positioned at both sides of each string. The supplementary pulse having the opposite polarity to that of each of the program voltage, the verification voltage, and the recovery voltage may be applied by means of operations of applying a voltage greater than 0 V to a common source and the ground selection transistor electrically connected to the string where the selected memory cell is located and applying a ground voltage to the selected memory cell.

Figure 9A:
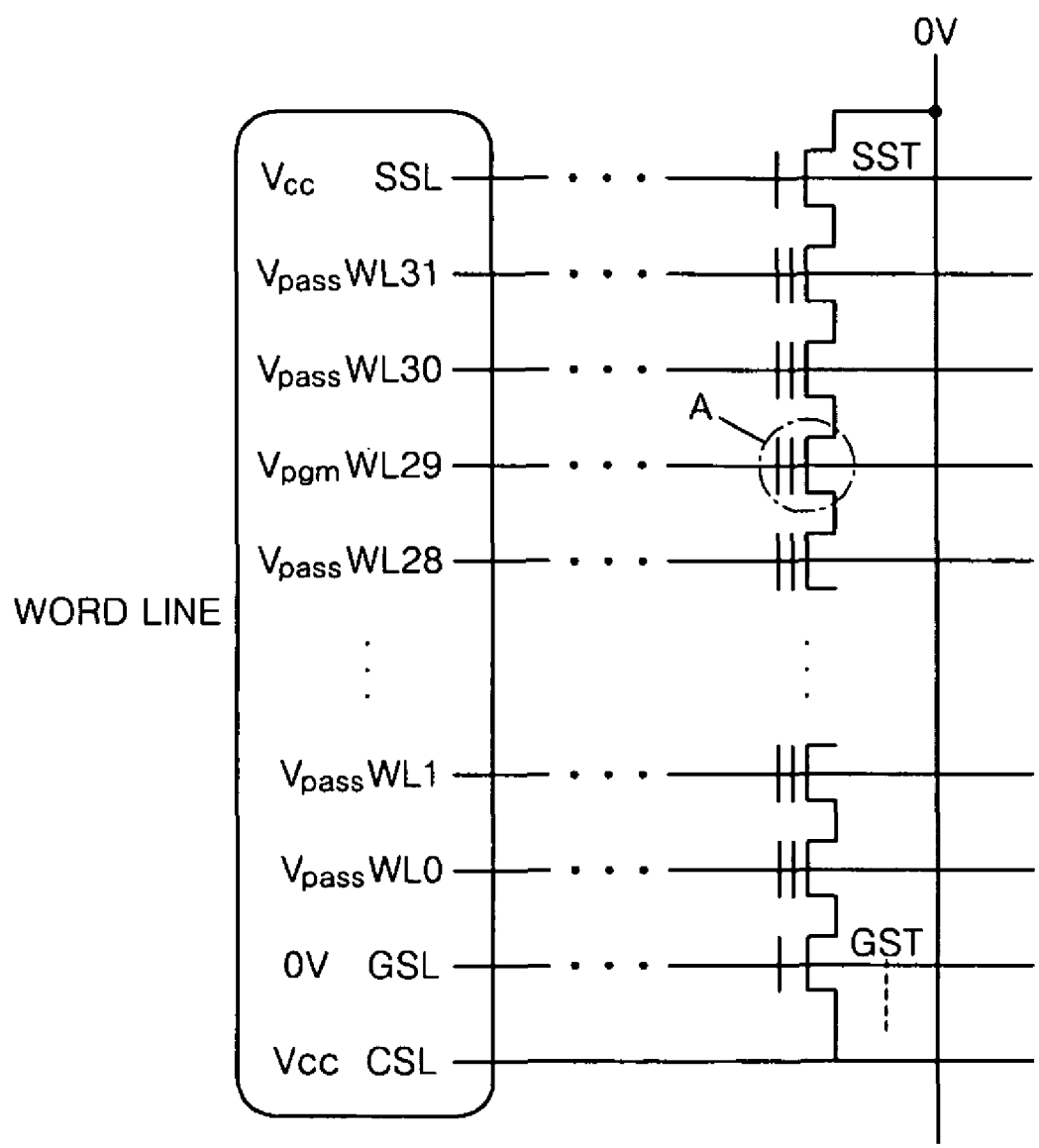
FIGS. 9A and 9B illustrate an operation of applying a program pulse to a selected word line.
Figure 9B:
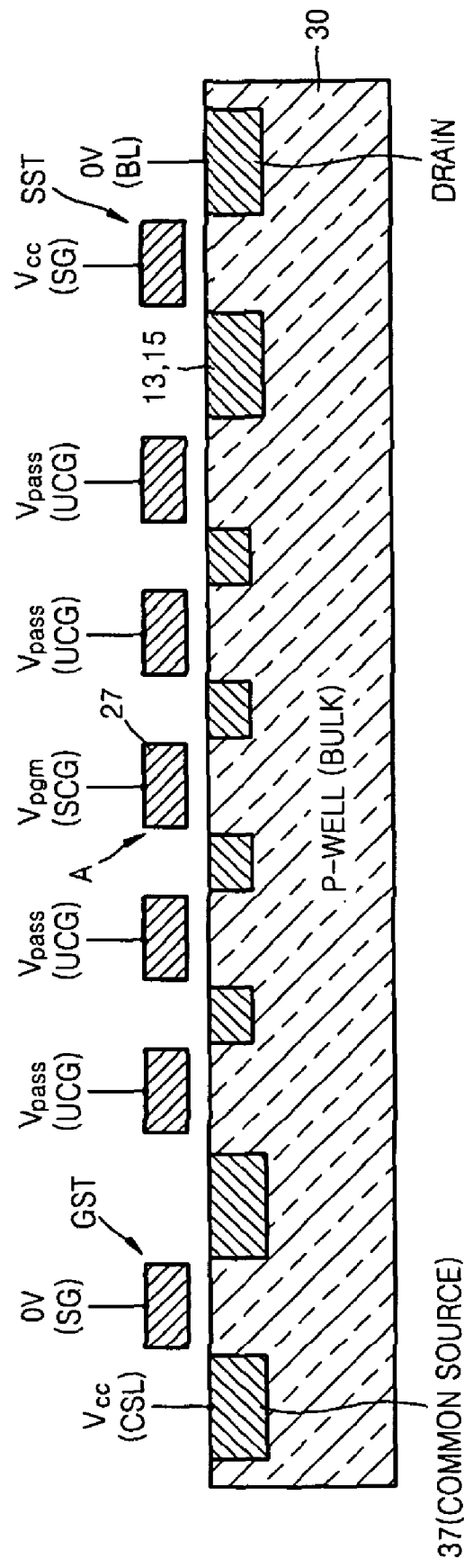
Figure 10A:
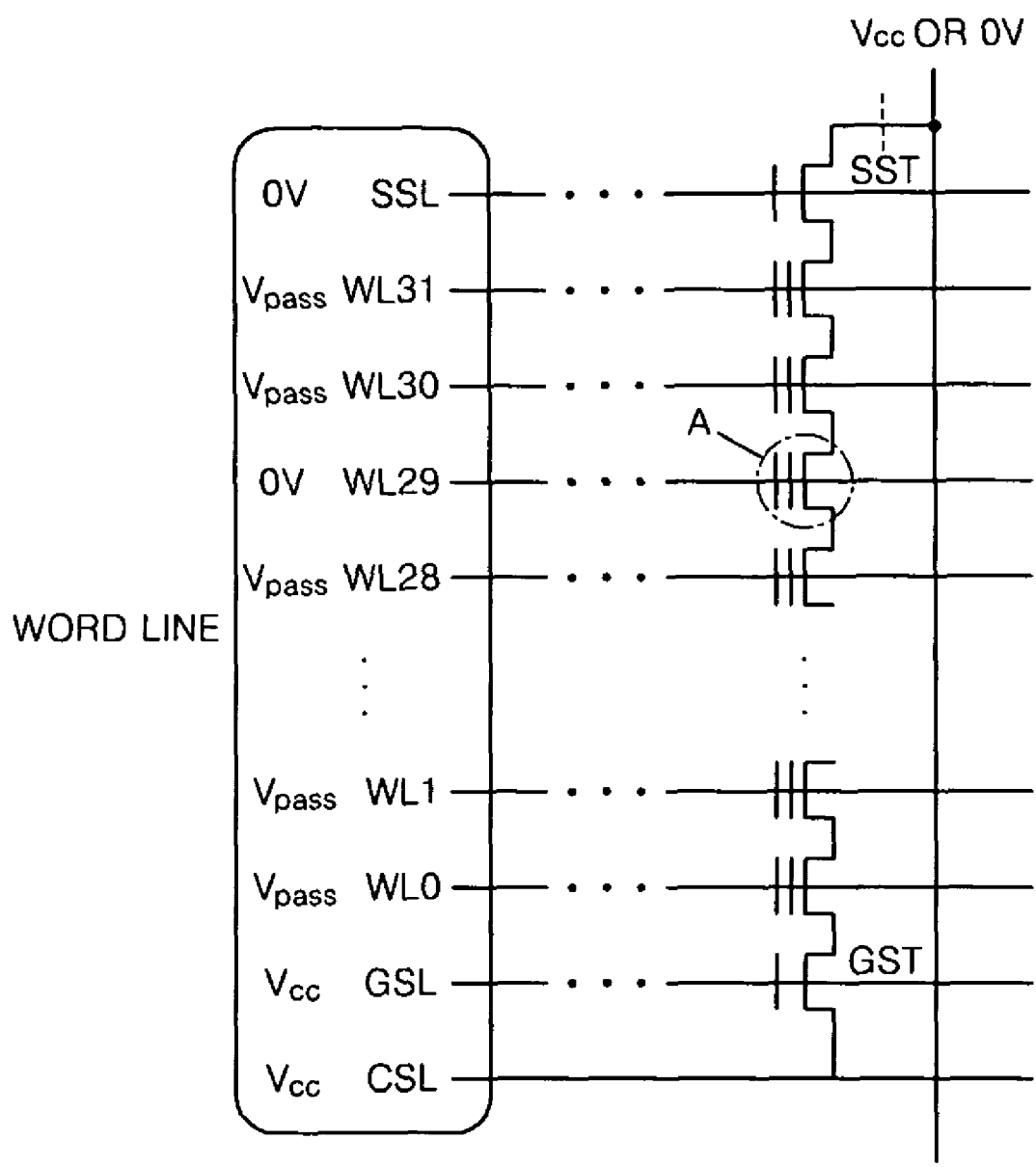
FIGS. 10A and 10B illustrate an operation of applying a supplementary pulse to a channel.
Figure 10B:
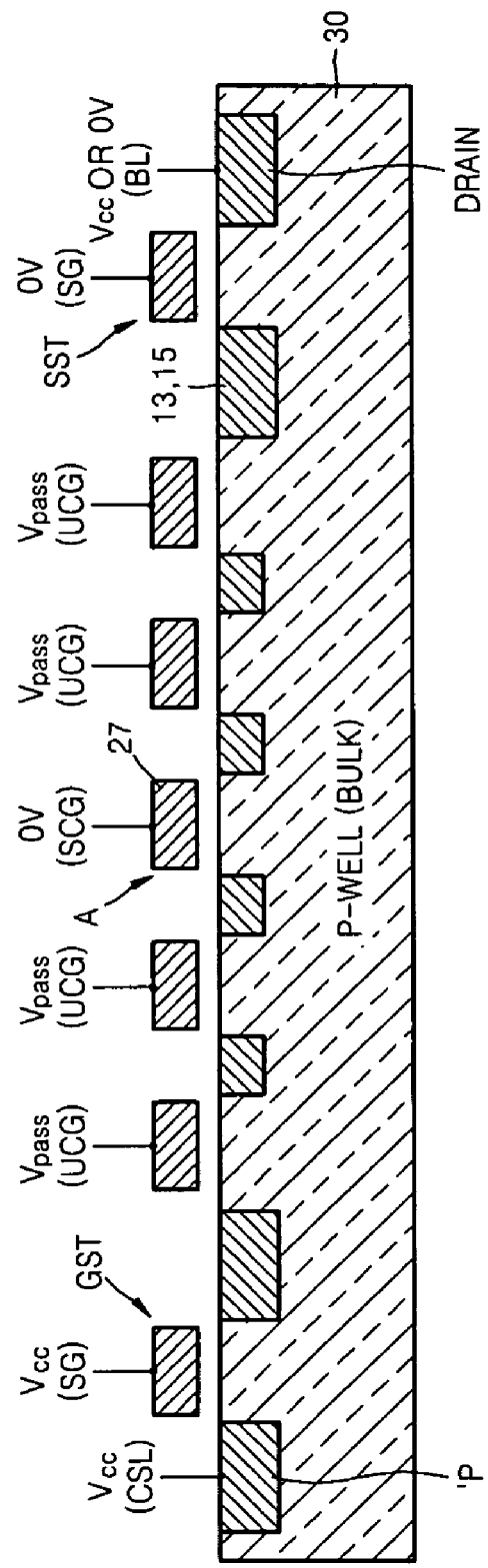
Figure 10C:
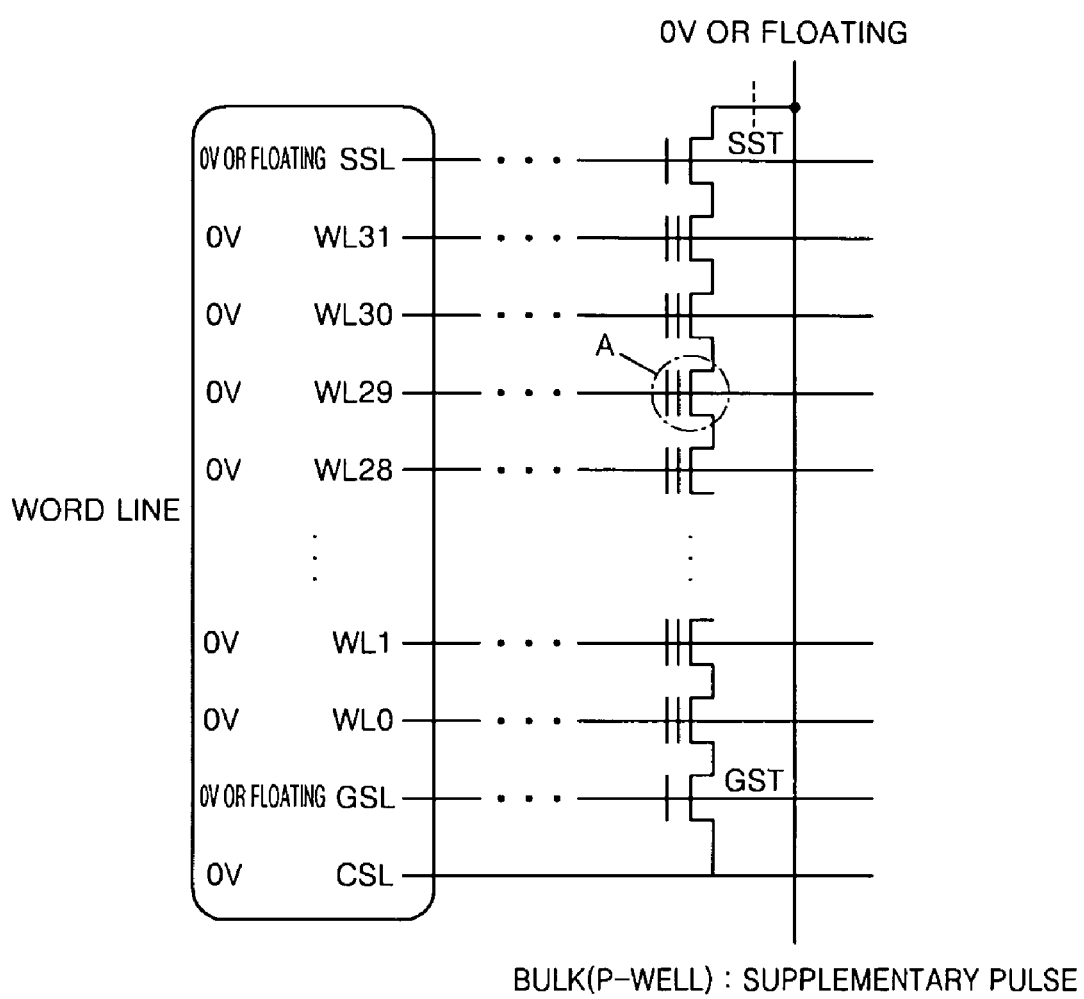
FIGS. 10C and 10D illustrate an operation of applying a supplementary pulse to a bulk or p-well.
Figure 10D:
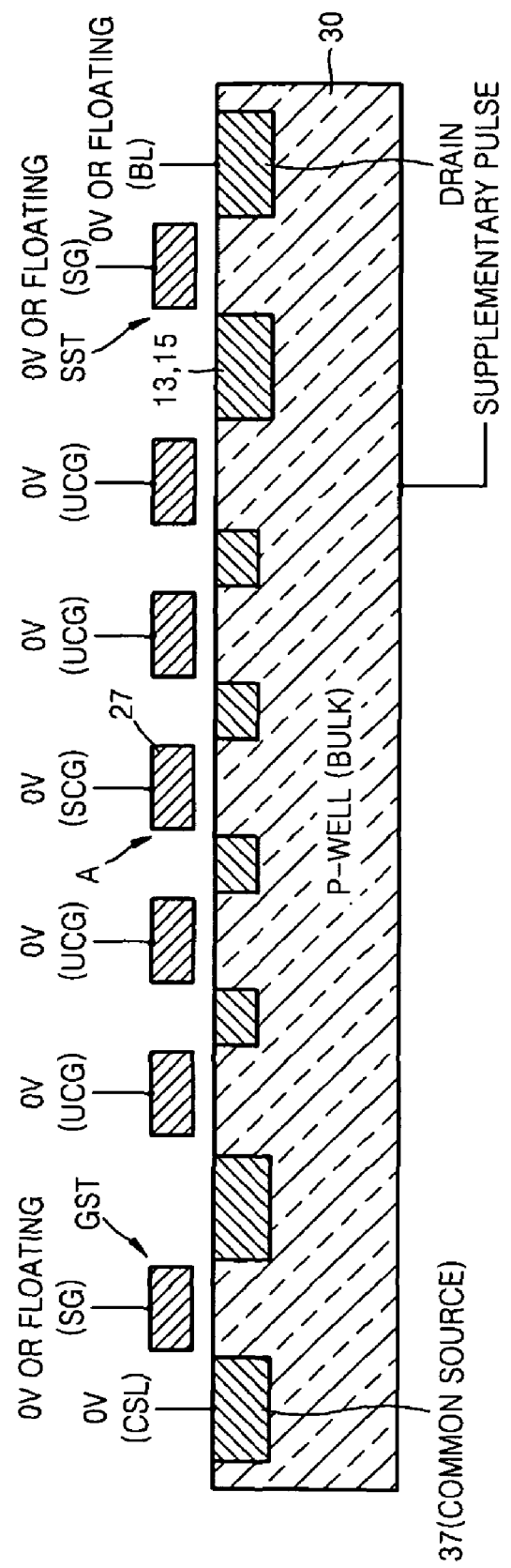
Figure 11A:
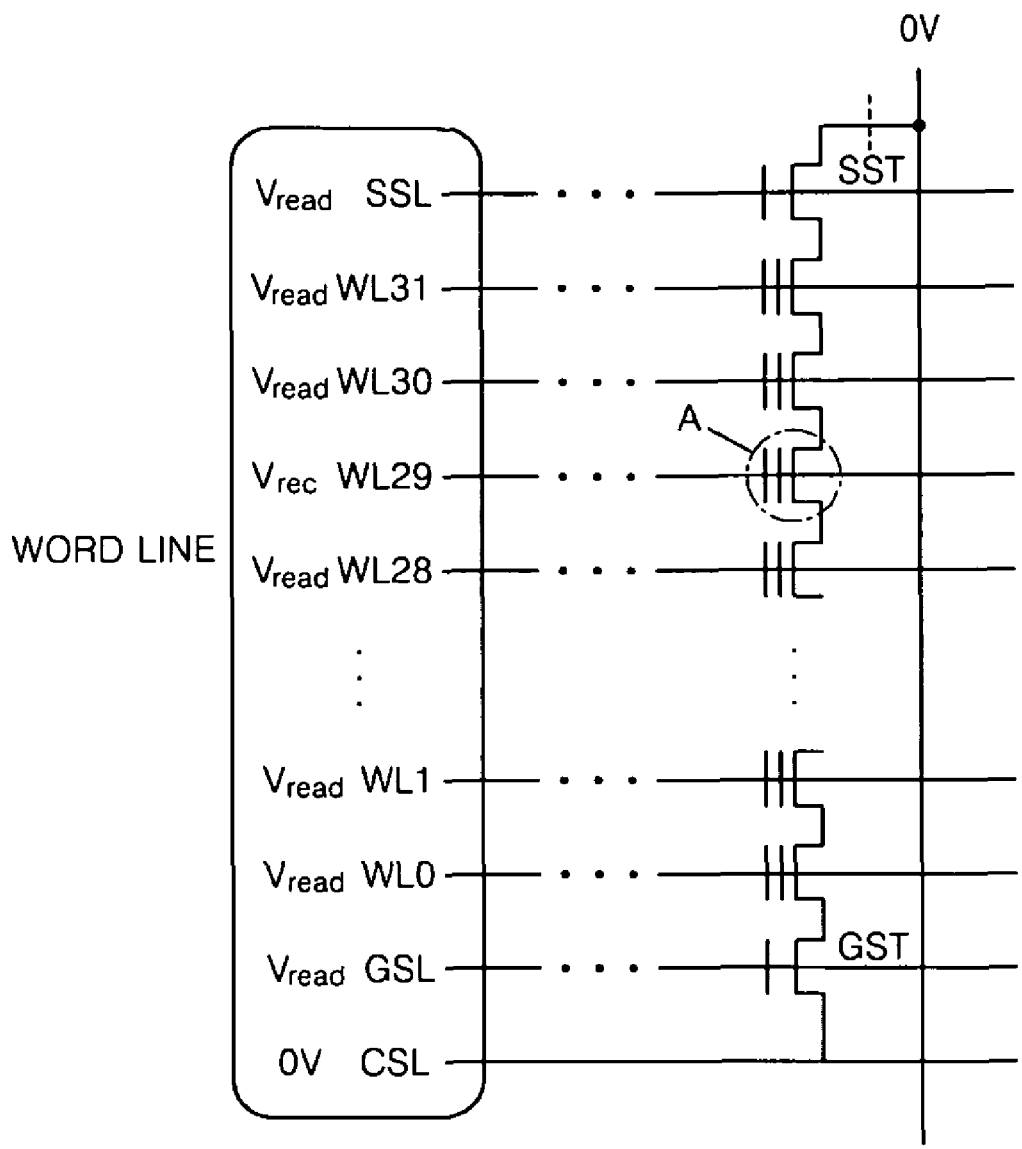
FIGS. 11A and 11B illustrate an operation of applying a recovery pulse to a selected word line.
Figure 11B:
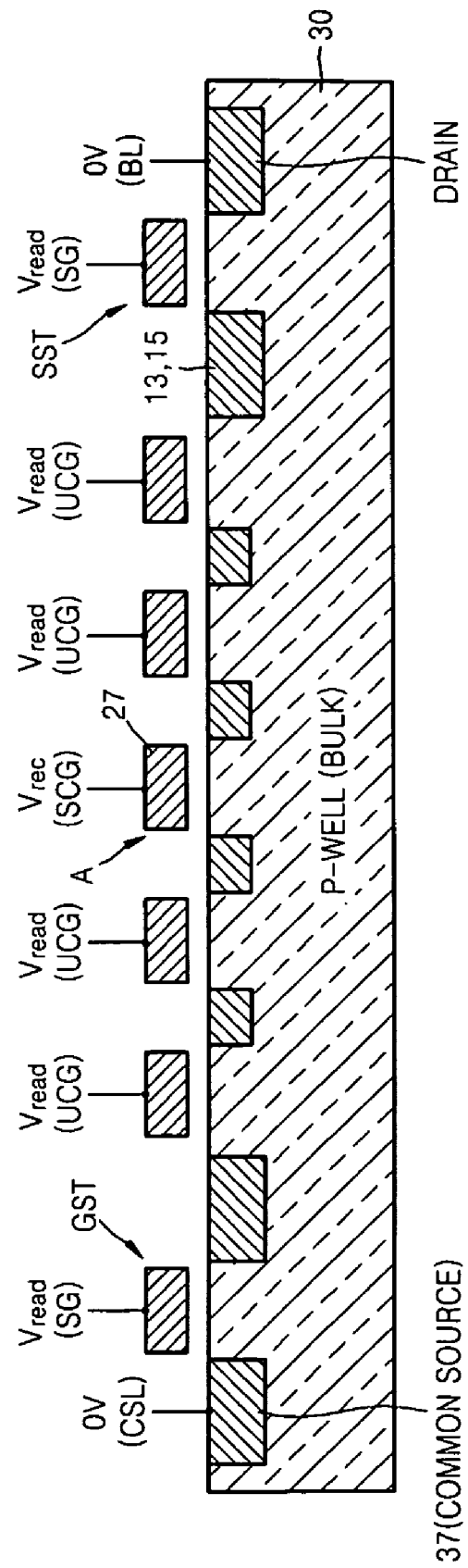
Figure 12A:
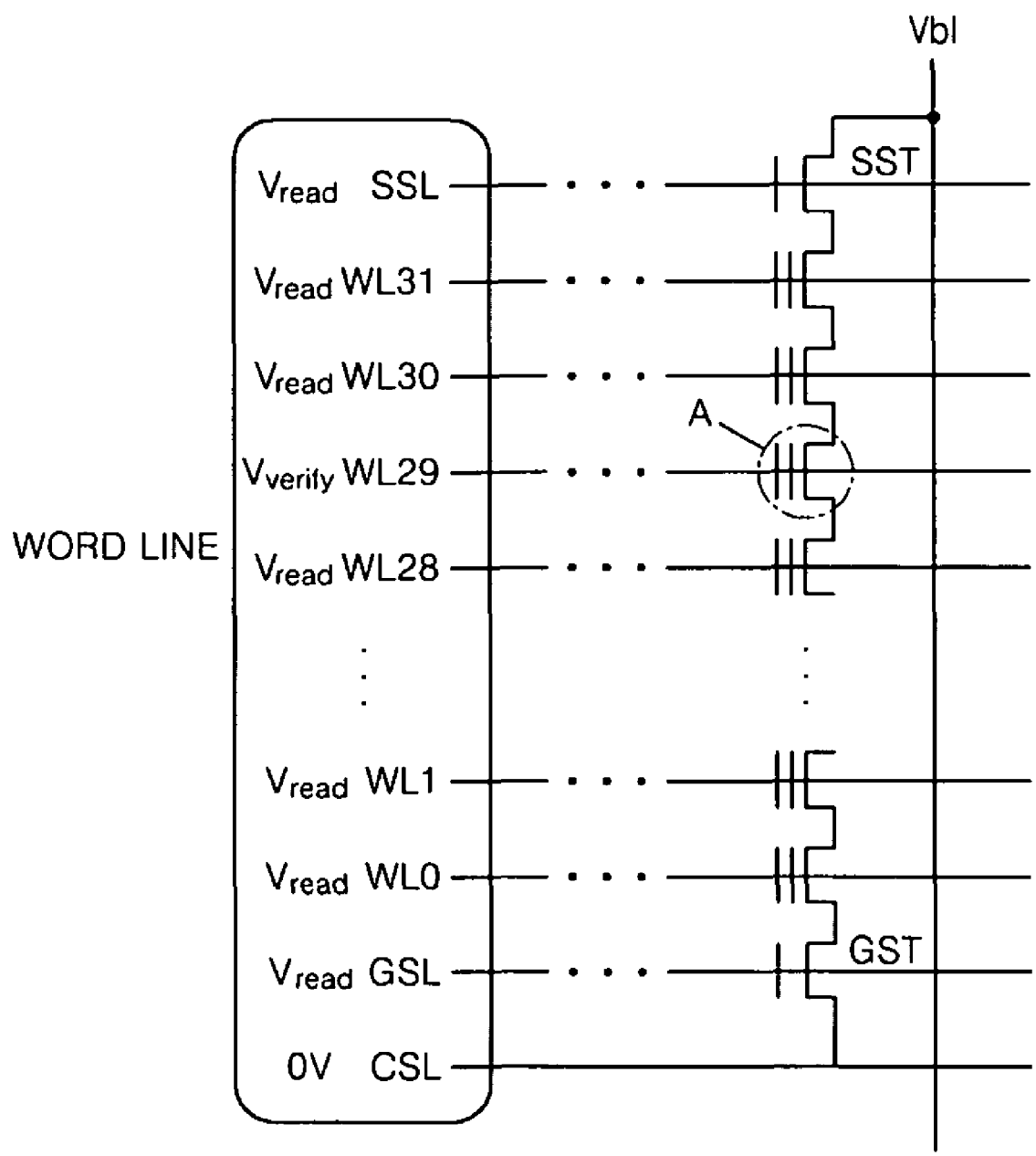
FIGS. 12A and 12B illustrate an operation of applying a verification pulse to a selected word line.
Figure 12B:
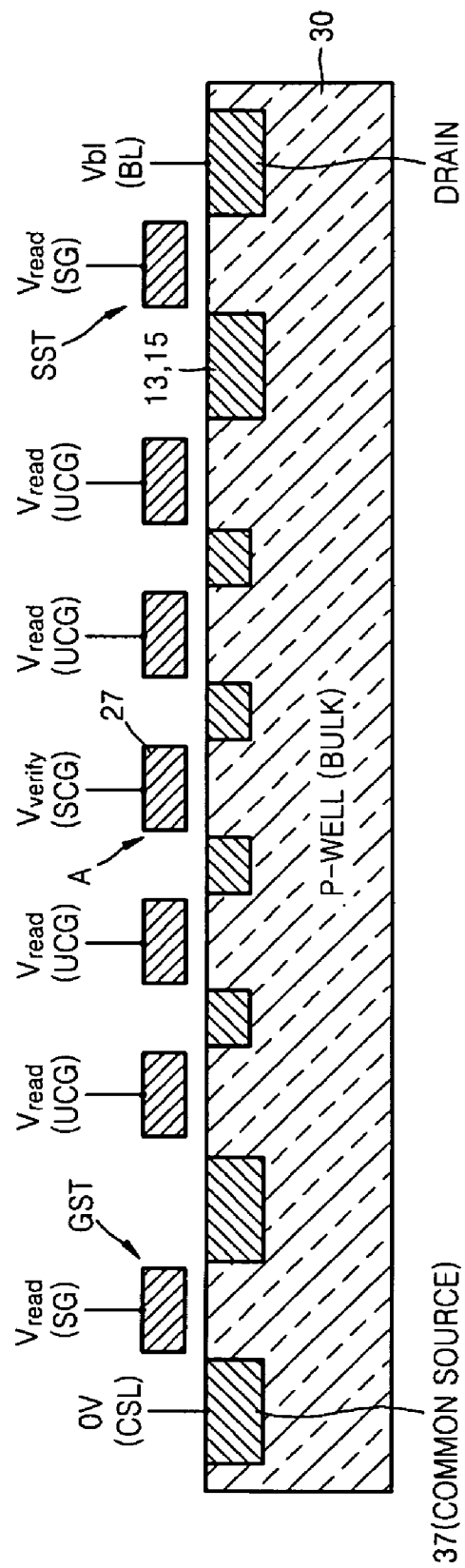

FIGS. 9A and 9B, 10A and 10B, 10C and 10D, 11A and 11B, 12A, and 12B illustrate a string of a NAND type flash memory device to which the programming method of the present embodiment is applied and are cross-sectional views of the string in a direction along the bit line. FIGS. 9A and 9B illustrate the operation of applying the program pulse to the selected word line. FIGS. 10A and 10B illustrate the operation of applying the supplementary pulse to the channel. FIGS. 10C and 10D illustrate the operation of applying the supplementary pulse to the bulk or p-well. FIGS. 11A and 11B illustrate the operation of applying the recovery pulse to the selected word line. FIGS. 12A and 12B illustrate the operation of applying the verification pulse to the selected word line. FIGS. 9B-12B illustrate an example in which five memory cells only are provided in a string for convenience of explanation. In FIGS. 9B-12B, the elements having the same functions as those of the element of the flash memory cell described with reference to FIG. 1 are indicated by using the same reference numerals so that the descriptions thereof will be omitted herein.

In the NAND type flash memory device, a block includes a plurality of cell strings as shown in FIG. 2. When an erasure operation is performed in units of blocks, the block may include a p-well 30 as shown in FIGS. 9B-12B. Referring to FIGS. 9B-12B, for example, a plurality of memory cells 10 are formed as an array in the p-well 30 formed in a semiconductor substrate. Source/drain regions 13 and 15 are shared between neighboring cells arranged in series in a string. The source/drain regions 13 and 15 are formed in the p-well 30. When a plurality of memory cell strings forming the block are formed in the p-well 30, the bulk to which the supplementary pulse is applied when the programming method of the present embodiment described with reference to FIGS. 5A and 8A is employed corresponds to the p-well 30. Also, the bulk to which the supplementary pulse is applied may be the substrate where the flash memory device is formed.

In FIGS. 9B-12B, SG indicates a selected gate of a ground selection transistor (GST) and a selected gate of a string selection transistor SST of a string where a memory cell A to be programmed is positioned. Also, in FIGS. 9B-12B, a selected control gate (SCG) indicates a selected control gate of the selected memory cell to be programmed and an unselected control gate (UCG) indicates an unselected control gate of a memory cell that is not selected as an object to be selected.

Referring to FIGS. 9A and 9B, in the operation of a string of a NAND type flash memory device to apply a program pulse to a selected word line, a program voltage Vpgm is provided to a selected control gate (SCG) 27 of the selected memory cell A via a selected word line, for example, a word line WL29. The selected memory cell A is a memory cell connected to the selected work line and located on a string to which a bit line voltage of 0 V is applied to enable programming during the application of a program pulse.

A pass voltage Vpass is provided to the control gate UCG of the unselected memory cell via unselected word lines WL31, WL30, and WL28-WL0. A ground voltage of 0 V is provided to a selected gate (SG) of the ground selection transistor (GST) via the ground selection line (GSL). A power voltage Vcc is provided to the selected gate (SG) of the string selection transistor (SST) via a string selection line (SSL). The ground voltage of 0 V is provided to a drain via the bit line electrically connected to the string where the memory cell to be programmed is located. The power voltage Vcc is provided to a common source 37 via a common source line (CSL) to prevent drain-induced leakage. The power voltage Vcc may be about 2-3 V.

For example, a voltage that is increased by 0.5 V in sequence from a basic voltage of 16 V may be provided as the program voltage Vpgm. A voltage of 8-10 V, for example, may be provided as the pass voltage Vpass.

The operation of the NAND type flash memory to apply the supplementary pulse to the channel after the program pulse is applied to the memory cell A to be programmed through a selected word line, as shown in FIGS. 9A and 9B, may be the same as that shown in FIGS. 10A and 10B. Referring to FIGS. 10A and 10B, to increase the channel voltage, the power voltage Vcc is applied to the common source 37 via the common source line CSL. The power voltage Vcc is applied to the gate of the ground selection transistor (GST) via the selection gate (SG) of the common source 37, that is, the ground selection line (GSL).

The program voltage applied to the selection word line in a state in which the power voltage Vcc is applied to the common source 37 and the selection gate of the common source 37 is decreased from the Vpgm to 0 V. That is, the ground voltage of 0 V is provided to the selected control gate (SCG) of the selected memory cell A connected to the selected word line, for example, the word line WL29.

The pass voltage Vpass is provided to the unselected control gate (UCG) of the unselected memory cell via the unselected word lines WL31, WL30, WL28-WL0. The ground voltage of 0 V is provided to the selected gate (SG) of the string selection transistor (SST) via the string selection line (SSL). The power voltage Vcc or ground voltage of 0 V may be provided to the drain via the bit line electrically connected to the string where the memory cell A to be programmed is located.

The operation of the NAND type flash memory to apply the supplementary pulse to the bulk (p-well) after the program pulse is applied to the memory cell A to be programmed through a selected word line, as shown in FIGS. 9A and 9B, may be the same as that shown in FIGS. 10C and 10D. Referring to FIGS. 10C and 10D, the supplementary pulse is applied to the bulk (p-well). The ground voltage of 0 V is applied to the common source 37 via the common source line (CSL). The ground voltage of 0 V may be applied to or the gate of the ground selection transistor (GST) via the selection gate (SG) of the common source 37, that is, the ground selection line (GSL) or the gate of the ground selection transistor (GST) may be floated. The program voltage applied to the selected word line may be reduced to 0 V from the Vpgm. That is, the ground voltage of 0 V may be provided to the selected control gate (SCG) of the selected memory cell A connected to the selected word line, for example, the word line WL29. The ground voltage of 0 V may be provided to the unselected control gate (UCG) of the unselected memory cell via the unselected word lines WL31, WL30, and WL28-WL0 or the selected gate (SG) may be floated. The ground voltage of 0 V may be provided to the drain via the bit line electrically connected to the string where the memory cell A to be programmed is positioned or the drain may be floated.

The operation of the NAND type flash memory to apply the recovery pulse to the selected word line after the supplementary pulse is applied to the channel as shown in FIGS. 10A and 10B or the supplementary pulse is applied to the bulk (p-well) as shown in FIGS. 10C and 10D, may be the same as that shown in FIGS. 11A and 11B. Referring to FIGS. 11A and 11B, a recovery pulse voltage Vrec is provided to the selected control gate (SCG) of the selected memory cell A via the selected word line, for example, the word line WL29. A read voltage Vread is provided to the unselected control gate (UCG) of the unselected memory cell via the unselected word lines WL31, WL30, and WL28-WL0.

The read voltage Vread is provided to the selected gate of the ground selection transistor (GST) via the ground selection line (GSL) and to the selected gate of the string selection transistor (SST) via the string selection line (SSL). The ground voltage of 0 V is provided to the drain via the bit line electrically connected to the string where the memory cell A to be programmed is positioned, and to the common source 37 via the common source line (CSL). The read voltage Vread is a pass voltage during reading and, for example, about 5-6 V.

The operation of the NAND type flash memory to apply the verification pulse to the selected word line after the recovery pulse is applied to the selected word line as shown in FIGS. 11A and 11B, may be the same as that shown in FIGS. 12A and 12B. Referring to FIGS. 12A and 12B, the verification pulse voltage Vverify is provided to the selected control gate (SCG) of the selected memory cell A via the selected word line, for example, the word line WL29. The read voltage Vread is provided to the unselected control gate (UCG) of the unselected memory cell via the unselected word lines WL31, WL30, and WL28-WL0. The read voltage Vread is provided to the selected gate (SC) of the ground selection transistor (GST) via the ground selection line (GSL) and to the selected gate (SG) of the string selection transistor (SST) via the string selection line (SSL). A bit line voltage Vbl is provided to the drain via the bit line electrically connected to the string where the memory cell A to be programmed is positioned. The ground voltage of 0 V is provided to the common source 37 via the common source line (CSL). The read voltage Vread may be, for example, about 5-6 V. The bit line voltage Vbl may be, for example, about 1-2 V, as a bit line voltage during the verification.

An effect of improved threshold voltage distribution according to the application of a supplementary pulse and a recovery voltage in a programming method according to example embodiments is described in comparison with a conventional programming method adopting the general ISPP scheme and a case in which only the supplementary pulse is applied to the control gate and the bulk, for example, the p-well or substrate.

Figure 14A:
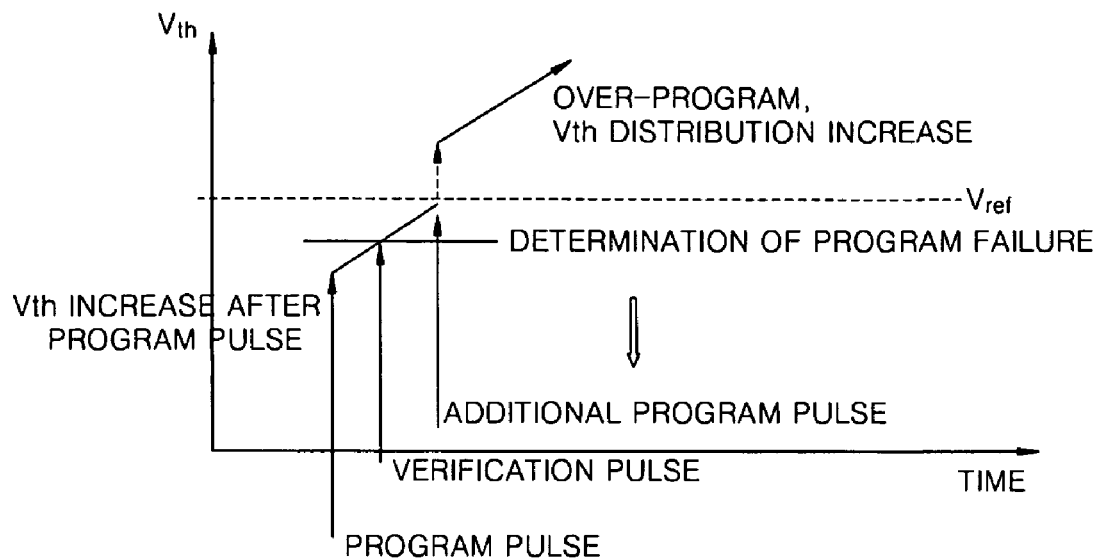
FIGS. 14A and 14B are example graphs showing a program scheme and the distribution of a threshold voltage of a memory cell if a conventional program method is applied.
Figure 14B:
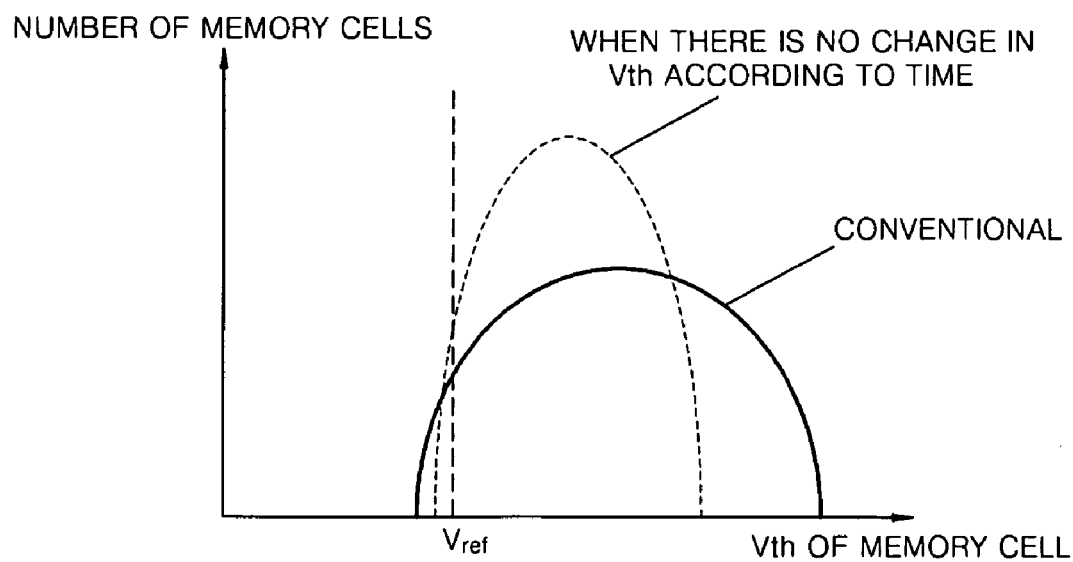

FIG. 13 is an example waveform diagram of an ISPP voltage pulse applied to the selected word line during programming in the general ISPP scheme and shows a change in the threshold voltage during the programming of a CTF memory cell using the ISPP voltage pulse. FIGS. 14A and 14B are example graphs showing a program scheme and the distribution of a threshold voltage of a memory cell if a conventional program method is applied.

Referring to FIG. 13, according to the general ISPP scheme, the memory cell selected by applying the program voltage to the word line is programmed and a verification voltage Vvef is applied for the verification of the program state of the memory cell. If the selected memory cell is determined to have failed to reach a desired, or alternatively, a predetermined threshold voltage, a program voltage increased by a desired, or alternatively, a predetermined amount may be applied to perform programming and the verification is performed again. In the general ISPP scheme, the program voltage is increased step by step until the memory cell is programmed to reach a set threshold voltage, and a single application of the verification operation is performed for a single application the programming operation.

For programming using the general ISPP scheme, a single application of a program voltage application operation and a single application of a verification operation may be repeated by increasing the program voltage step by step, for example, from 16 V by 0.5 V increments.

During programming, a charge trap type flash memory cell may have a transient threshold voltage (Vth) characteristic causing the threshold voltage (Vth) to increase with the passage of time after a program voltage is applied. Therefore, if programming is performed using a program pulse of 17 V and the threshold voltage is determined to be lower than the verification voltage Vref, the threshold voltage gradually increases with time so that the threshold voltage may eventually exceed the verification voltage Vref.

Accordingly, as shown in FIG. 14A, if the programming is determined to have failed in the verification operation, a program pulse may be applied so that the memory cell is over-programmed. Therefore, as shown in FIG. 14B, the distribution of the threshold voltage of the memory cell is greater as compared to a case in which no change exists in the threshold voltage according to the time.

If the programming is performed using the general ISPP scheme, even a sufficiently programmed memory cell may be determined as a program fail and additionally programmed due to the transient threshold voltage characteristic so that the larger distribution of the threshold voltage may be more highly likely to be generated.

Figure 15:
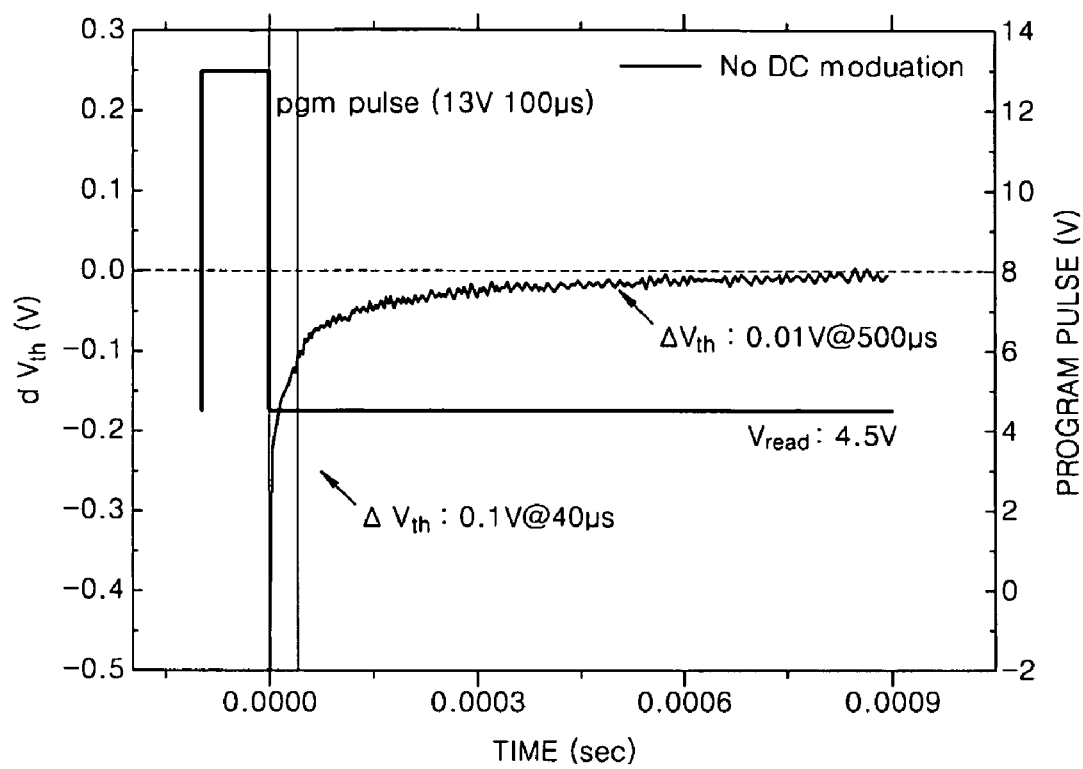
FIG. 15 is an example graph showing a change in a threshold voltage of a memory cell after a program voltage is applied if there is no supplementary pulse, e.g., no DC modulation exists.

FIG. 15 is an example graph showing a change in the threshold voltage of a memory cell after a program voltage is applied if no supplementary pulse, e.g., no DC modulation, exists. In FIG. 15, the vertical axis at the left side indicates a change in the threshold voltage (ΔVth) and the horizontal axis indicates a time.

Referring to FIG. 15, after a program pulse (pgm pulse) of 13 V is applied for 100 μs, a memory cell is read using a read voltage (Vread) of 4.5 V. The change in the threshold voltage until saturation is about 0.1 V at a time of about 40 μs, and about 0.01 V at a time of about 500 μs, after a program voltage is applied.

Therefore, a longer time is needed until the threshold voltage of a memory cell is saturated after the program voltage is applied. In a programming method according to example embodiments, the time for the threshold voltage of a memory cell to reach the saturation state may be shortened by applying the supplementary pulse via the bulk and the recovery voltage to the selected memory cell.

Figure 16:
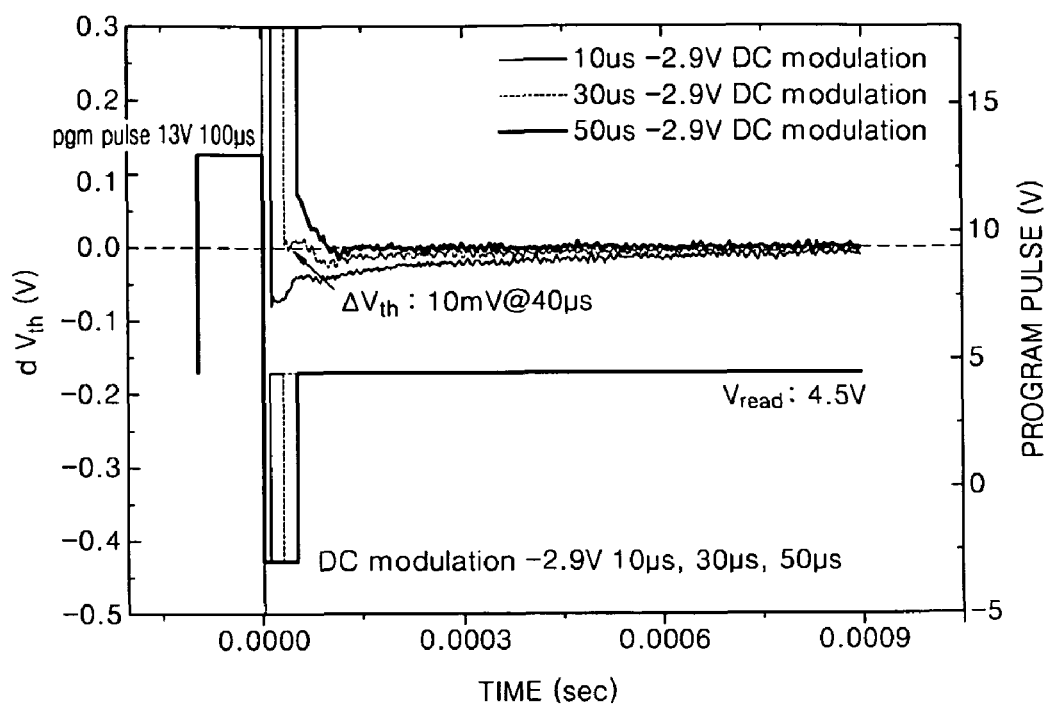
FIG. 16 is an example graph showing a change in a threshold voltage of a memory cell according to a DC supplementary pulse application time during gate pulse modulation in which a supplementary pulse having a polarity opposite to that of a program pulse, e.g., a DC modulation, is applied to the memory cell via the control gate after the program voltage is applied.

FIG. 16 is an example graph showing a change of the threshold voltage of a memory cell according to a DC supplementary pulse application time during gate pulse modulation in which a supplementary pulse having a polarity opposite to that of a program pulse, e.g., a DC modulation, is applied to the memory cell via the control gate after the program pulse is applied. In FIG. 16, the vertical axis of left side indicates the change in the threshold voltage (ΔVth) and the horizontal axis indicates a time.

Referring to FIG. 16, after a program voltage of 13 V is applied during a period of 100 μs, a DC supplementary pulse of −2.9 V is applied and a memory cell is read using a read voltage Vread of 4.5 V. Comparing FIGS. 15 and 16, the change in the threshold voltage is greatly reduced if the DC supplementary pulse is applied for 10 μs, 30 μs, and 50 μs. For example, if a DC supplementary pulse of −2.9 V is applied for 30 μs, the threshold voltage change ΔVth at a time of 40 μs after the program voltage is applied is about 10 mV, which is greatly reduced compared to the threshold voltage change amount ΔVth of about 0.1 V if the DC supplementary pulse is not applied.

As can be seen from a comparison between FIGS. 15 and 16, if the DC supplementary pulse having a polarity opposite to that of the program voltage is applied, a time required for the thermalization of the threshold voltage may be greatly shortened.

If the DC supplementary pulse is applied to the selected memory cell via a word line, (e.g., via the control gate), the time required for thermalization of the threshold voltage may be greatly reduced. However, in order to apply the DC supplementary pulse as a negative pulse via the selected word line, (e.g., via the control gate), a voltage generator for generating a negative voltage may need to be provided in a circuit of the nonvolatile memory.

Therefore, after the program voltage is applied, the DC supplementary pulse may be applied as a positive pulse through the bulk. However, a saturation time of the threshold voltage becomes relatively longer than that of the case in which the supplementary pulse is applied to the control gate. Even if the DC supplementary pulse is applied through the bulk, the threshold voltage saturation time may be greatly reduced compared to a conventional method in which the supplementary pulse is not applied at all.

Figure 17:
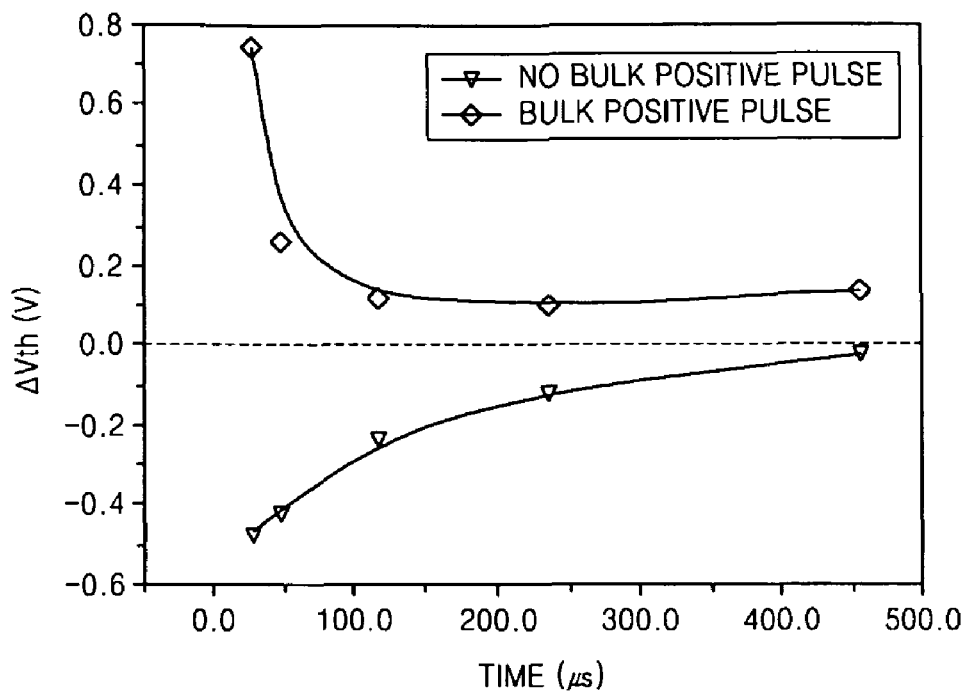
FIG. 17 is an example graph showing a comparison of a change in the threshold voltage according to a passage of time if a positive pulse is not applied to the bulk and if a positive pulse is applied to the bulk.

FIG. 17 is an example graph showing a comparison of a change in the threshold voltage according to a passage of time if a positive pulse is not applied to the bulk and if a positive pulse is applied to the bulk. The change in the threshold voltage if the positive pulse is applied in FIG. 17 is a result obtained by applying a program voltage of 15 V for 100 μs and a positive pulse of 9 V for 5 μs to the bulk.

Referring to FIG. 17, if the positive pulse is applied to the bulk the saturation time is reduced. Nevertheless, the threshold voltage Vth gradually decreases as time passes after the positive pulse is applied and the saturation time is relatively longer, e.g., about 50-100 μs, because a discharge time is needed after the positive pulse is applied to the bulk.

Figure 18:
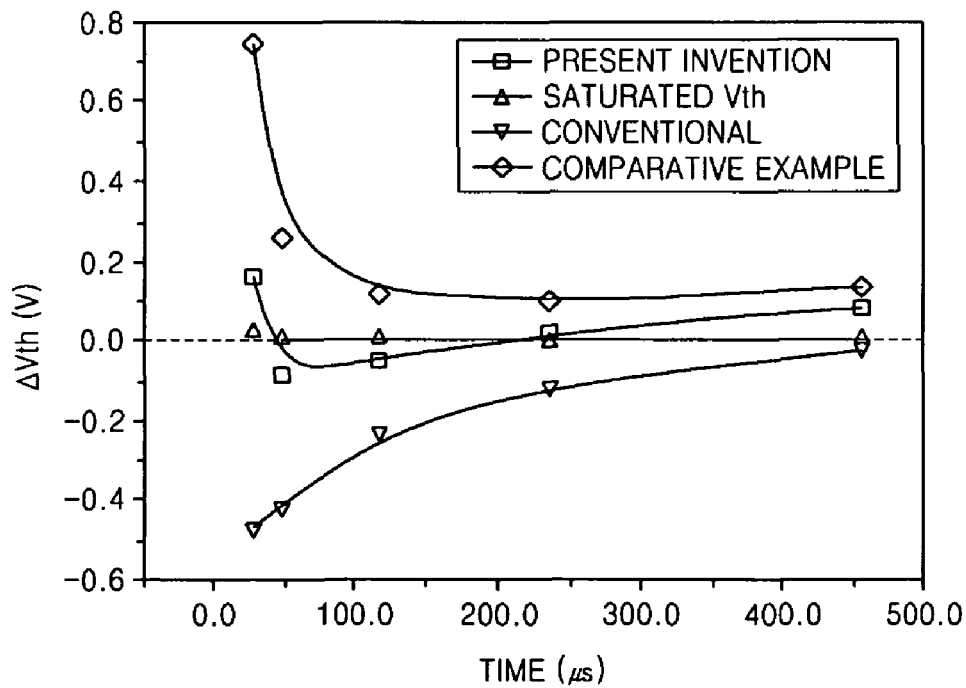
FIG. 18 is an example graph showing a change in a threshold voltage according to a passage of time if a recovery voltage is applied after a positive pulse is applied to a bulk as in a program method according to an example embodiment in comparison with the result of FIG. 17.

FIG. 18 is an example graph showing a comparison of a change in the threshold voltage according to a passage of time if a recovery voltage is applied after a positive pulse is applied to the bulk as in a programming method according to example embodiments in comparison with the group of FIG. 17. In FIG. 18, the saturated threshold voltage Vth indicates a threshold voltage measured in a saturated state after a delay of about 100 μs. The threshold voltage in a comparative example is measured by applying the program voltage, the DC supplementary pulse to the bulk, and the read voltage. A conventional threshold voltage is measured by applying the program voltage and the read voltage without applying the DC supplementary pulse to the bulk. The example graphs of FIG. 17 and FIG. 18 are the same in terms of the threshold voltage change with respect to the conventional method and the comparison example.

The threshold voltage in a programming method according to an example embodiment is measured by applying the program voltage, the DC supplementary pulse to the bulk, the recovery voltage of 12 V for 10 μs, and the read voltage. As can be seen from FIGS. 17 and 18, in the comparative example, about 100 μs is required to saturate the threshold voltage. In contrast, if the recovery voltage is applied to the selected memory cell for about 5 μs after applying the DC supplementary pulse applied through the bulk, a time for saturating the threshold voltage is greatly reduced compared to the comparative example.

In a program method according to example embodiments, the supplementary pulse applied through the bulk may be, for example, a positive voltage that is not greater than 10 V (e.g., with reference to a voltage of the bulk). The recovery voltage applied to the memory cell via the word line after the application of the supplementary pulse may be a pulse type voltage, for example, a positive voltage of about 3-10 V (e.g., with reference to a voltage of the control gate).

As described above, according to a programming method of example embodiment, by applying a recovery voltage after a supplementary pulse applied through the bulk or channel, a thermalization of charges may be facilitated so that the threshold voltage reaches a saturation state within a relatively shorter time. Therefore, an occurrence of over-program due to a determination error may be reduced so that the threshold voltage distribution may be improved.

If the supplementary pulse is applied for each ISPP, a program time may be as much as a supplementary pulse application time multiplied by a number of times of application (e.g., t supplementary pulse×m). In another example embodiment, application of the verification voltage may be divided into two steps and the supplementary pulse may be applied only after the memory cell passes the verification using a first verification voltage Vref. Therefore, the threshold voltage distribution may be reduced and the program time may be efficiently reduced compared to a case of applying the supplementary pulse for each ISPP.

In a programming method according to example embodiments, because the distribution of the threshold voltage of the memory cells corresponding to each record state may be smaller, each record state in a multi-level cell operation may be separately recognized.

As described above, a programming method according to example embodiments may be applied to a flash memory device having charge trap type flash memory cells or floating gate type flash memory cells. However, example embodiments are not limited thereto. For example, a programming method according to example embodiments may be applied to any nonvolatile memory device, e.g., any nonvolatile memory device having a charge thermalization.

According to the programming method of the present invention, after the program voltage is applied, the supplementary pulse is applied to the lower bulk or channel of the memory cell and then the recovery pulse is applied.

Also, according to the programming method of the present invention, since the threshold voltage reaches a saturation state within a short time by facilitating the thermalization of charges, an over-program due to a determination error can be prevented.

Also, according to the programming method of the present invention, when the supplementary pulse is applied to the bulk or channel by applying the recovery pulse, a saturation time of the threshold voltage may be relatively reduced in comparison to the time for applying the supplementary pulse to the gate.

When the programming method of the present invention is employed, since the distribution of the threshold voltage of the cells corresponding to the respective program state is small, the program state in each multi-level cell operation can be separately recognized.

Although example embodiments have been shown and described in this specification and figures, it would be appreciated by those skilled in the art that changes may be made to the illustrated and/or described example embodiments without departing from their principles and spirit.

What is claimed is:

1. A method of programming a nonvolatile memory device, the method comprising:
applying a program voltage to a memory cell;
applying a supplementary pulse to the memory cell to facilitate thermalization of charges after the application of the program voltage;
applying a recovery voltage to the memory cell after the application of the supplementary pulse; and
verifying a program state of the memory cell using a verification voltage after the application of the recovery voltage.

2. The method of claim 1, wherein the supplementary pulse applies an electric field having a polarity opposite to that of an electric field generated by the program voltage.

3. The method of claim 1, wherein the supplementary pulse is applied via a bulk or channel where the memory cell is formed.

4. The method of claim 1, wherein the applying the program voltage, the applying the supplementary pulse, the applying the recovery voltage, and the verifying the program state are repeated by increasing a level of the program voltage step by step until the program state of the memory cell passes the verification using the verification voltage.

5. The method of claim 1, wherein
the memory cell comprises a control gate and a charge storage layer, and
the program voltage, the recovery voltage, and the verification voltage are applied to the control gate of the memory cell.

6. The method of claim 5, wherein the recovery voltage is a positive voltage having the same polarity as that of each of the verification voltage and the program voltage and the supplementary pulse has a polarity opposite to that of each of the program voltage, the recovery voltage, and the verification voltage.

7. The method of claim 5, wherein the memory cell is at least one of a floating gate type flash memory cell and a charge trap type flash memory cell.

8. The method of claim 5, wherein the non-volatile memory device has a NAND structure of a plurality of memory cells formed on a bulk and the memory cell is a memory cell selected from the memory cells arranged in the NAND.

9. The method of claim 8, wherein the bulk is a p-well formed on a semiconductor substrate and the memory cells are formed in the p-well in an array to share source/drain.

10. The method of claim 9, wherein the NAND structure comprises a plurality of strings, each having a plurality of memory cell arrays, and a ground selection transistor and a string selection transistor positioned at both sides of each string, and the application of a supplementary pulse having a polarity opposite to that of each of the program voltage, the verification voltage, and the recovery voltage is performed by operations of applying a voltage that is greater than 0 V to a common source and a ground selection transistor electrically connected to a string where a selected memory cell is positioned and applying a ground voltage to the selected memory cell.

11. A method of programming a nonvolatile memory device, the method comprising:
applying a program voltage to a memory cell and verifying a program state of the memory cell using a first verification voltage in a first programming operation;
applying a supplementary pulse to the memory cell to facilitate thermalization of charges with respect to the memory cell if the program state of the memory cell passes the verification using the first verification voltage in the first programming operation;
applying a recovery voltage to the memory cell after the application of the supplementary pulse; and
verifying the program state of the memory cell using a second verification voltage greater than the first verification voltage after the application of the recovery voltage.

12. The method of claim 11, wherein the supplementary pulse is applied via a bulk or channel where the memory cell is formed.

13. The method of claim 11, wherein the recovery voltage is a positive voltage greater than the first and second verification voltages and having the same polarity as that of each of the first and second verification voltages and the program voltage, and the supplementary pulse has a polarity opposite to that of each of the program voltage, the recovery voltage, and the first and second verification voltages.

14. The method of claim 11, wherein the supplementary pulse applies an electric field opposite to an electric field generated by the program voltage.

15. The method of claim 12, further comprising:
applying the program voltage to the memory cell, applying the supplementary pulse to facilitate the thermalization of charges via the bulk or channel, applying the recovery voltage, and verifying the program state of the memory cell using the second verification voltage in a second programming operation if the program state of the memory cell fails the verification using the second verification voltage.

16. The method of claim 15, wherein, in the second programming operation, the application of the program voltage, the application of the supplementary pulse, the application of the recovery voltage, and the verifying the program state of the memory cell using the second verification voltage are repeated by increasing the program voltage step by step until the memory cell passes the verification using the second verification voltage in the second programming operation.

17. The method of claim 16, wherein, in the first programming operation, the application of the program voltage and the verifying the program state of the memory cell using the first verification voltage are repeated by increasing the program voltage step by step until the program state of the memory cell passes the verification using the first verification voltage.

18. The method of claim 11, wherein, in the first programming operation, the application of the program voltage and the verifying the program state of the memory cell using the first verification voltage are repeated by increasing the program voltage step by step until the program state of the memory cell passes the verification using the first verification voltage.

19. The method of claim 11, wherein
the memory cell comprises a control gate and a charge storage layer, and
the program voltage, the recovery voltage, and the first and second verification voltages are applied to the control gate of the memory cell.

20. The method of claim 19, wherein the memory cell is at least one of a floating gate type flash memory cell and a charge trap type flash memory cell.

21. The method of claim 19, wherein the non-volatile memory device has a NAND structure of a plurality of memory cells formed on a bulk, and the memory cell is one selected from the memory cells arranged in the NAND structure.

22. The method of claim 21, wherein the bulk is a p-well formed on a semiconductor substrate and the memory cells are formed in the p-well in an array to share source/drain.

23. The method of claim 22, wherein the NAND structure comprises a plurality of strings, each having a plurality of memory cell arrays, and a ground selection transistor and a string selection transistor positioned at both sides of each string, and the application of a supplementary pulse having a polarity opposite to that of each of the program voltage, the verification voltage, and the recovery voltage is performed by operations of applying a voltage that is greater than 0 V to a common source and a ground selection transistor electrically connected to a string where a selected memory cell is positioned and applying a ground voltage to the selected memory cell.

* * * * *